(12) United States Patent
Masuda et al.

(10) Patent No.: US 11,079,627 B2
(45) Date of Patent: Aug. 3, 2021

(54) LIQUID CRYSTAL DISPLAY APPARATUS

(71) Applicant: SHARP KABUSHIKI KAISHA, Sakai (JP)

(72) Inventors: Masatsugu Masuda, Sakai (JP); Hideaki Fujii, Sakai (JP); Takeshi Kawahara, Sakai (JP); Toshiyuki Tanaka, Sakai (JP); Kenichi Yoshimura, Sakai (JP); Makoto Yoshimura, Sakai (JP); Masataka Miyata, Sakai (JP); Takehiro Shiomoto, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 0 days.

(21) Appl. No.: 16/284,374

(22) Filed: Feb. 25, 2019

(65) Prior Publication Data

US 2019/0235318 A1    Aug. 1, 2019

Related U.S. Application Data

(63) Continuation of application No. 15/517,487, filed as application No. PCT/JP2015/078079 on Oct. 2, 2015, now Pat. No. 10,261,360.

(51) Int. Cl.
| | |
|---|---|
| G02F 1/13357 | (2006.01) |
| G02F 1/1335 | (2006.01) |
| G02F 1/1343 | (2006.01) |
| G02F 1/1333 | (2006.01) |
| F21V 9/30 | (2018.01) |
| C09K 11/61 | (2006.01) |

(Continued)

(52) U.S. Cl.
CPC ........ G02F 1/133603 (2013.01); C09B 11/04 (2013.01); C09K 11/617 (2013.01); C09K 11/7734 (2013.01); F21V 9/30 (2018.02); G02B 5/223 (2013.01); G02F 1/133514 (2013.01); G02F 1/134363 (2013.01); H01L 33/50 (2013.01); H01L 33/504 (2013.01); C09K 11/0883 (2013.01); G02F 2001/133357 (2013.01); G02F 2001/133614 (2013.01); G02F 2001/133624 (2013.01); Y02B 20/00 (2013.01)

(58) Field of Classification Search
CPC ... G02F 1/133603; G02F 2001/133614; G02F 1/133514
See application file for complete search history.

(56) References Cited

U.S. PATENT DOCUMENTS

| | | | | |
|---|---|---|---|---|
| 5,391,442 A | * | 2/1995 | Tsushima | G03F 7/0007 430/15 |
| 2004/0095521 A1 | * | 5/2004 | Song | G02F 1/133514 349/61 |
| 2014/0152934 A1 | * | 6/2014 | Huh | G02F 1/133784 349/43 |

* cited by examiner

Primary Examiner — Lucy P Chien
(74) Attorney, Agent, or Firm — ScienBiziP, P.C.

(57) ABSTRACT

A liquid crystal display device includes: a liquid crystal display panel that includes red color filters, green color filters, and blue color filters; and an illumination device that illuminates the liquid crystal display panel with white light. The illumination device includes light-emitting elements that emit blue light, a green phosphor that absorbs a portion of the blue light emitted from the light-emitting elements and then emits green light, and a red phosphor that absorbs a portion of the blue light emitted from the light-emitting elements and then emits red light. The blue color filters are made of a colored material that contains a dye, and the chromaticity values x and y of the white light emitted from (Continued)

the illumination device satisfy the relationships 0.24<x and 0.24<y.

9 Claims, 22 Drawing Sheets

(51) Int. Cl.
*G02B 5/22* (2006.01)
*C09B 11/04* (2006.01)
*C09K 11/77* (2006.01)
*H01L 33/50* (2010.01)
*C09K 11/08* (2006.01)

CIE1976

LIQUID CRYSTAL DISPLAY APPARATUS

TECHNICAL FIELD

The present invention relates to a liquid crystal display device.

BACKGROUND ART

Currently, pseudo-white light-emitting diodes (LEDs) are commonly used as a light source for backlights in liquid crystal display devices. In pseudo-white LEDs, LEDs that emit blue light are used in combination with a yellow phosphor that emits yellow light when excited by the blue light, thereby making it possible to emit white light (consequently, these are sometimes referred to as blue-yellow pseudo-white LEDs). Pseudo-white LEDs offer excellent performance in terms of luminous efficacy and cost.

Patent Document 1 discloses a technology for displaying significantly brighter images on a liquid crystal display device that includes pseudo-white LEDs. Patent Document 1 describes how using pseudo-white LEDs that have a prescribed emission spectrum in combination with color filters that have prescribed spectral transmission characteristics makes it possible to increase the brightness of the white display state without changing the chromaticity coordinates of the white display state.

RELATED ART DOCUMENT

Patent Document

Patent Document 1: Japanese Patent Application Laid-Open Publication No. 2009-36964

SUMMARY OF THE INVENTION

Problems to be Solved by the Invention

However, the following problems arise when attempting to make the color specifications of a liquid crystal display device that includes pseudo-white LEDs as the light source for the backlight compliant with high color purity standards such as the sRGB standard, the Adobe RGB standard, and DCI standards (that is, when attempting to achieve high color reproduction performance).

Pseudo-white LEDs exhibit a relatively broad emission spectrum within the visible spectrum. Therefore, to achieve high color purity, the spectral transmission characteristics of the color filters must be strictly controlled to ensure that the color filters achieve adequate color separation. This tends to result in a decrease in the transmittance of the color filters, which in turn decreases the transmittance (panel transmittance) of the overall liquid crystal display panel. Moreover, as the thickness of the color filters is increased, leakage of light from adjacent pixels when the display is viewed from an angle (known as "color washout") tends to become more prominent. Furthermore, increasing the area of a light shielding layer to prevent such light leakage decreases the pixel aperture ratio, thereby further decreasing the panel transmittance.

In addition, in Patent Document 1, the extent of the effects that can be achieved (that is, to what extent the brightness of the white display state can be increased) is not explicitly described, nor are the spectral transmission characteristics of the color filters specifically identified. Furthermore, even when using the technology disclosed in Patent Document 1, it would likely be difficult to achieve color specifications that are compliant with high color purity standards (such as the abovementioned sRGB and Adobe RGB standards), particularly in regards to blue colors.

The present invention was made in view of the abovementioned problems and aims to provide a liquid crystal display device that makes it possible to achieve excellent color reproduction and high panel transmittance.

Means for Solving the Problems

A liquid crystal display device according to an embodiment of the present invention includes: a liquid crystal display panel including a red color filter, a green color filter, and a blue color filter; and an illumination device illuminating the liquid crystal display panel with white light, wherein the illumination device includes a light-emitting element that emits blue light, a green phosphor that absorbs a portion of the blue light emitted from the light-emitting element and then emits green light, and a red phosphor that absorbs a portion of the blue light emitted from the light-emitting element and then emits red light, wherein the blue color filter is made of a colored material that contains a dye, and wherein chromaticity values x, y of the white light emitted from the illumination device satisfy relationships 0.24<x and 0.24<y.

In one embodiment, a peak wavelength of an emission spectrum of the green phosphor is 520 nm to 540 nm.

In one embodiment, the green phosphor is a bivalent europium-activated oxynitride β-SiAlON phosphor represented by a general formula (A): $Si_{6-z}Al_zO_zN_{8-z}:Eu_x$, where z and x satisfy relationships $0<z<4.2$ and $0.003<x<0.03$.

In one embodiment, a ratio Ia/Ib of an emission spectrum of the red phosphor is less than 0.1, where Ia is an integrated intensity at wavelengths greater than or equal to 650 nm and Ib is an integrated intensity over all wavelength regions.

In one embodiment, the red phosphor is a tetravalent manganese-activated tetravalent metal fluoride salt phosphor represented by a general formula (B): $M^I_2(M^{II}_{1-h}Mn_h)F_6$, where $M^I$ is at least one alkali metal element selected from a group consisting of Li, Na, K, Rb, and Cs; $M^{II}$ is at least one tetravalent element selected from a group consisting of Ge, Si, Sn, Ti, and Zr; and h satisfies the relationship $0.01<h<0.2$.

In one embodiment, the dye contained in the colored material is a triphenylmethane dye.

In one embodiment, the colored material further contains a pigment.

In one embodiment, an emission spectrum of the illumination device has peaks in wavelength regions of 442 nm to 453 nm, 525 nm to 535 nm, 611 nm to 615 nm, 629 nm to 633 nm, and 645 nm to 649 nm; a transmission spectrum of the red color filter exhibits a transmittance of less than or equal to 5% at wavelengths of 400 nm to 580 nm, exhibits an increase in transmittance at wavelengths of 580 nm to 585 nm, and exhibits a transmittance of greater than or equal to 80% at wavelengths of greater than or equal to 625 nm, and a wavelength at which the transmission spectrum of the red color filter exhibits a transmittance of greater than or equal to 50% is included in a range of 595 nm to 605 nm; a transmission spectrum of the green color filter has a peak in transmittance in a wavelength region of 505 nm to 525 nm, exhibits a transmittance of less than or equal to 5% at wavelengths of less than or equal to 465 nm and at wavelengths of 600 nm to 680 nm, and wavelengths at which the transmission spectrum of the green color filter exhibits a transmittance of 50% are respectively included in a range of 485 nm to 490 nm and a range of 556 nm to 562 nm; and a transmission spectrum of the blue color filter has a peak in transmittance in a wavelength region of 420 nm to 450 nm, exhibits a transmittance of 30% to 50% at a wavelength of 400 nm and a transmittance of 10% to 20% at a wavelength of 500 nm, and wavelengths at which the transmission spectrum of the blue color filter exhibits a transmittance of 50% are respectively included in a range of 400 nm to 410 nm and a range of 468 nm to 478 nm.

In one embodiment, an emission spectrum of the illumination device has peaks in wavelength regions of 442 nm to 453 nm, 525 nm to 535 nm, 611 nm to 615 nm, 629 nm to 633 nm, and 645 nm to 649 nm; a transmission spectrum of the red color filter exhibits a transmittance of less than or equal to 10% at wavelengths of 400 nm to 560 nm, exhibits an increase in transmittance at wavelengths of 560 nm to 570 nm, and exhibits a transmittance of greater than or equal to 90% at wavelengths of greater than or equal to 620 nm, and a wavelength at which the transmission spectrum of the red color filter exhibits a transmittance of 50% is included in a range of 588 nm to 593 nm; a transmission spectrum of the green color filter has a peak in transmittance in a wavelength region of 505 nm to 525 nm, exhibits a transmittance of less than or equal to 5% at wavelengths of less than or equal to 465 nm and at wavelengths of 600 nm to 680 nm, and wavelengths at which the transmission spectrum of the green color filter exhibits a transmittance of 50% are respectively included in a range of 485 nm to 490 nm and a range of 557 nm to 562 nm; and a transmission spectrum of the blue color filter has a peak in transmittance in a wavelength region of 415 nm to 460 nm, exhibits a transmittance of 50% to 70% at a wavelength of 400 nm and a transmittance of 35% to 45% at a wavelength of 500 nm, and a wavelength at which the transmission spectrum of the blue color filter exhibits a transmittance of 50% is included in a range of 490 nm to 500 nm.

In one embodiment, an emission spectrum of the illumination device has peaks in wavelength regions of 442 nm to 453 nm, 535 nm to 545 nm, 611 nm to 615 nm, 629 nm to 633 nm, and 645 nm to 649 nm; a transmission spectrum of the red color filter exhibits a transmittance of less than or equal to 5% at wavelengths of 400 nm to 575 nm, exhibits an increase in transmittance at wavelengths of 575 nm to 580 nm, and exhibits a transmittance of greater than or equal to 90% at wavelengths of greater than or equal to 620 nm, and a wavelength at which the transmission spectrum of the red color filter exhibits a transmittance of greater than or equal to 50% is included in a range of 595 nm to 605 nm; a transmission spectrum of the green color filter has a peak in transmittance in a wavelength region of 512 nm to 532 nm, exhibits a transmittance of less than or equal to 5% at wavelengths of less than or equal to 470 nm and at wavelengths of 600 nm to 670 nm, and wavelengths at which the transmission spectrum of the green color filter exhibits a transmittance of 50% are respectively included in a range of 488 nm to 493 nm and a range of 561 nm to 567 nm; and a transmission spectrum of the blue color filter has a peak in transmittance in a wavelength region of 415 nm to 460 nm, exhibits a transmittance of 50% to 70% at a wavelength of 400 nm and a transmittance of 48% to 58% at a wavelength of 500 nm, and a wavelength at which the transmission spectrum of the blue color filter exhibits a transmittance of 50% is included in a range of 496 nm to 505 nm.

In one embodiment, an emission spectrum of the illumination device has peaks in wavelength regions of 442 nm to 453 nm, 535 nm to 545 nm, 611 nm to 615 nm, 629 nm to 633 nm, and 645 nm to 649 nm; a transmission spectrum of the red color filter exhibits a transmittance of less than or equal to 5% at wavelengths of 400 nm to 560 nm, exhibits an increase in transmittance at wavelengths of 560 nm to 570 nm, and exhibits a transmittance of greater than or equal to 90% at wavelengths of greater than or equal to 620 nm, and a wavelength at which the transmission spectrum of the red color filter exhibits a transmittance of greater than or equal to 50% is included in a range of 590 nm to 595 nm; a transmission spectrum of the green color filter has a peak in transmittance in a wavelength region of 515 nm to 535 nm, exhibits a transmittance of less than or equal to 10% at wavelengths of less than or equal to 465 nm and at wavelengths of 625 nm to 670 nm, and wavelengths at which the transmission spectrum of the green color filter exhibits a transmittance of 50% are respectively included in a range of 477 nm to 482 nm and a range of 590 nm to 595 nm; and a transmission spectrum of the blue color filter has a peak in transmittance in a wavelength region of 415 nm to 460 nm, exhibits a transmittance of 50% to 70% at a wavelength of 400 nm and a transmittance of 45% to 55% at a wavelength of 500 nm, and a wavelength at which the transmission spectrum of the blue color filter exhibits a transmittance of 50% is included in a range of 495 nm to 505 nm.

In one embodiment, the thicknesses of the red color filter, the green color filter, and the blue color filter are each less than or equal to 2.5 µm.

In one embodiment, the liquid crystal display panel includes a color filter substrate that includes the red color filter, the green color filter, and the blue color filter, and the color filter substrate further includes a planarizing layer formed covering the red color filter, the green color filter, and the blue color filter.

In one embodiment, a liquid crystal display device having one of the configurations described above displays images using a lateral electric field mode.

Effects of the Invention

An embodiment of the present invention provides a liquid crystal display device that makes it possible to achieve excellent color reproduction and high panel transmittance.

DETAILED DESCRIPTION OF EMBODIMENTS

Next, an embodiment of the present invention will be described with reference to figures. Note that the present invention is not limited to the embodiment described below.

Figure 1:
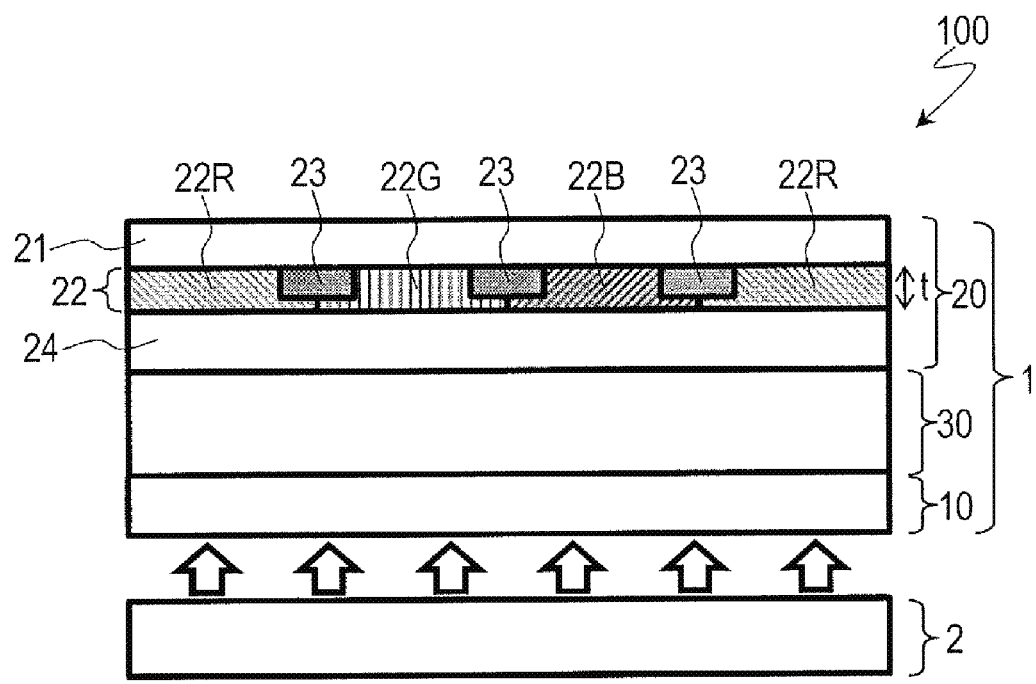
FIG. 1 is a cross-sectional view schematically illustrating a liquid crystal display device 100 according to an embodiment of the present invention.

FIG. 1 illustrates a liquid crystal display device 100 according to the embodiment of the present invention. FIG. 1 is a cross-sectional view schematically illustrating the liquid crystal display device 100.

As illustrated in FIG. 1, the liquid crystal display device 100 includes a liquid crystal display panel 1 and an illumination device (backlight) 2. The liquid crystal display device 100 also includes a plurality of pixels arranged in a matrix pattern. This plurality of pixels includes red pixels for displaying red, green pixels for displaying green, and blue pixels for displaying blue. Each group of three pixels that display different colors (that is, a red pixel, a green pixel, and a blue pixel) forms a single color display pixel.

The liquid crystal display panel 1 includes an active matrix substrate (hereinafter, a "TFT substrate") 10, a color filter substrate (hereinafter, an "opposite substrate") 20 arranged facing the TFT substrate 10, and a liquid crystal layer 30 arranged between the TFT substrate 10 and the color filter substrate 20.

The TFT substrate 10 includes pixel electrodes formed for each pixel and thin-film transistors (TFTs) that are electrically connected to the pixel electrodes (note that neither of these components are illustrated in the figure). The TFT substrate 10 further includes scanning lines for supplying scanning signals to the TFTs and signal lines for supplying display signals to the TFTs (note that neither of these components are illustrated in the figure).

The color filter substrate 20 includes red color filters 22R, green color filters 22G, blue color filters 22B, and a light shielding layer (black matrix) 23. The red color filters 22R, the green color filters 22G, and the blue color filters 22B are respectively formed in regions corresponding to the red pixels, regions corresponding to the green pixels, and regions corresponding to the blue pixels. The red color filters 22R, the green color filters 22G, and the blue color filters 22B will sometimes be referred to collectively as "color filter layers 22." The light shielding layer 23 is formed between adjacent pixels. The color filter layers 22 and the light shielding layer 23 are supported by an insulating transparent substrate (such as a glass substrate) 21. Moreover, in the example illustrated in FIG. 1, the color filter substrate 20 further includes a planarizing layer 24 formed covering the color filter layers 22. The planarizing layer 24 does not necessarily need to be included.

When a twisted nematic (TN) mode or a vertical alignment (VA) mode is used as the display mode, the color filter substrate 20 further includes a counter electrode (common electrode) formed facing the pixel electrodes. Here, examples of well-known VA modes include multi-domain vertical alignment (MVA) modes and continuous pinwheel alignment (CPA) modes. Moreover, when a horizontal electric field mode is used as the display mode, the TFT substrate 10 further includes a common electrode in addition to the pixel electrodes. Here, examples of well-known horizontal electric field modes include in-plane switching (IPS) modes and fringe field switching (FFS) modes.

The liquid crystal layer 30 may be a horizontally aligning liquid crystal layer or a vertically aligning liquid crystal layer, for example, depending on the display mode used. Alignment films (not illustrated in the figure) are respectively formed on the liquid crystal layer 30 side surfaces of the TFT substrate 10 and the color filter substrate 20.

The illumination device 2 emits white light towards the liquid crystal display panel 1. The illumination device 2 is arranged on the rear side of the liquid crystal display panel 1 (that is, on the side opposite to the viewer).

Figure 2:
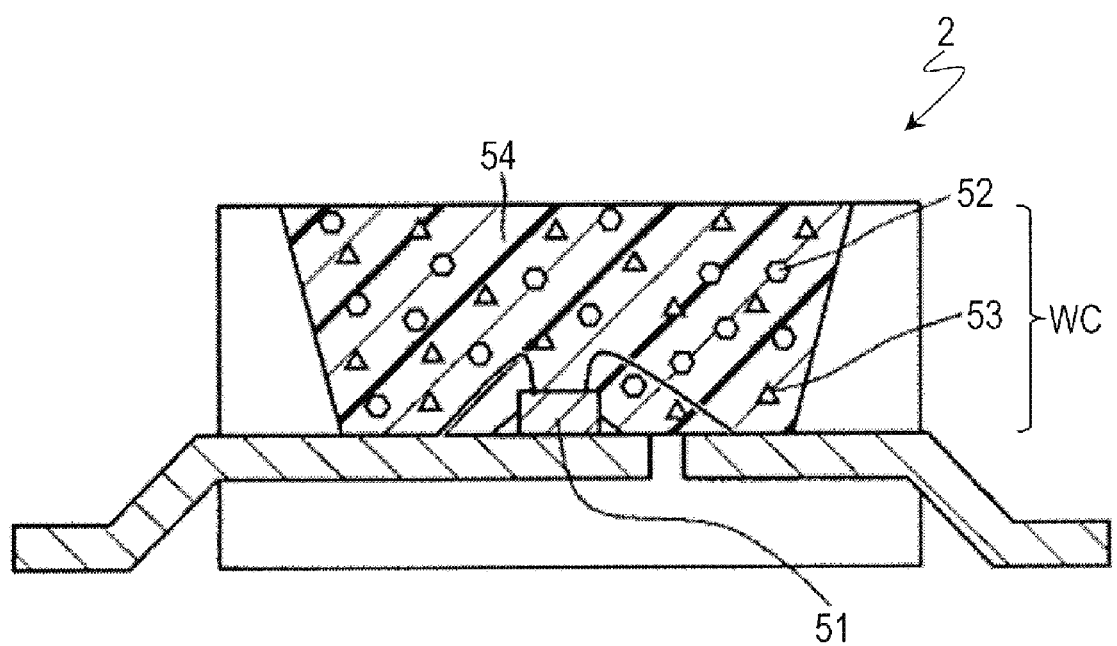
FIG. 2 is a cross-sectional view schematically illustrating an illumination device 2 of the liquid crystal display device 100.

FIG. 2 illustrates an example of a specific configuration for the illumination device 2. FIG. 2 is a cross-sectional view schematically illustrating the illumination device 2. As illustrated in FIG. 2, the illumination device 2 includes light-emitting elements 51, a green phosphor 52, and a red phosphor 53.

The light-emitting elements 51 emit blue light. Gallium nitride (GaN) semiconductor light-emitting elements that emit blue light with a peak wavelength of greater than or equal to 430 nm and less than or equal to 480 nm (or more preferably greater than or equal to 440 nm and less than or equal to 480 nm) can be preferably used as the light-emitting elements (hereinafter "blue light-emitting elements") 51. Using light-emitting elements with a peak wavelength of less than 430 nm can potentially decrease the strength of the blue light component and thereby result in poorer color rendition. Moreover, using light-emitting elements with a peak wavelength of greater than 480 nm can potentially result in a decrease in the brightness of white colors.

The green phosphor 52 absorbs a portion of the blue light emitted from the light-emitting elements 51 as excitation light and then emits green light. The red phosphor 53 absorbs a portion of the blue light emitted from the light-emitting elements 51 as excitation light and then emits red light. Specific examples of the green phosphor 52 and the red phosphor 53 will be described in detail later. The green phosphor 52 and the red phosphor 53 are sealed within a sealing material 54 and function as a wavelength converter WC that absorbs a portion of the light emitted from the light-emitting elements 51 and then emits light of a longer wavelength.

A transparent resin material such as an epoxy resin, a silicone resin, or a urea resin can be used for the sealing material 54, but the sealing material 54 is not limited to these examples. Moreover, the wavelength converter WC may further contain an additive such as $SiO_2$, $TiO_2$, $ZrO_2$, $Al_2O_3$, or $Y_2O_3$ as appropriate in addition to the green phosphor 52, the red phosphor 53, and the sealing material 54 described above.

Currently, pigmented color filters (which exhibit excellent durability) are typically used for the color filters in liquid crystal display devices. In contrast, in the liquid crystal display device 100 according to the embodiment of the present invention, the blue color filters 22B are made of a colored material that contains a dye.

Moreover, in the liquid crystal display device 100, the chromaticity values x and y of the white light emitted from the illumination device 2 satisfy the relationships 0.24<x and 0.24<y. In other words, the chromaticity of the white light emitted from the illumination device 2 is shifted slightly more towards the yellow side than in conventional configurations (this will be described in more detail later).

The liquid crystal display device 100 configured as described above exhibits excellent color reproduction and high panel transmittance. The reasons for this are as follows.

Figure 3:
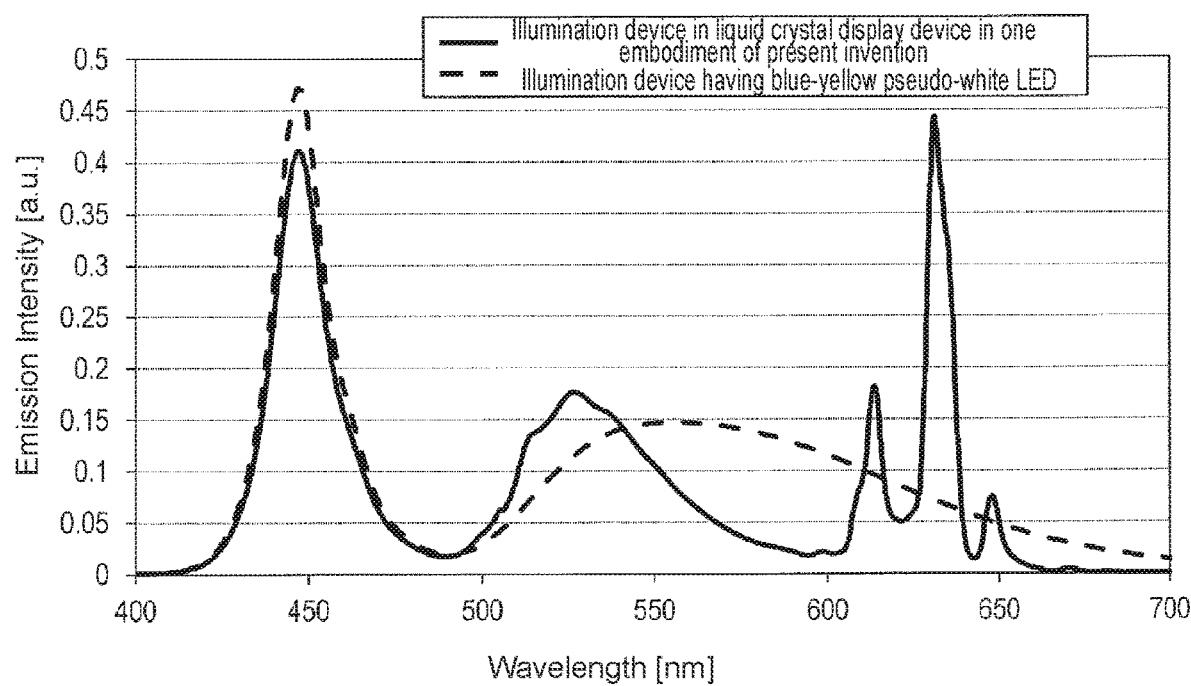
FIG. 3 is a graph showing an example of the emission spectrum of the illumination device 2.

As described above, the liquid crystal display device 100 includes the illumination device 2, which includes the blue light-emitting elements 51, the green phosphor 52, and the red phosphor 53. FIG. 3 shows an example of the emission spectrum of the illumination device 2 of the liquid crystal display device 100. FIG. 3 also shows an example of the emission spectrum of an illumination device that includes blue-yellow pseudo-white LEDs as the light source for comparison (the dashed line).

As shown in FIG. 3, the emission spectrum of the illumination device 2 of the liquid crystal display device 100 has a single peak in both the wavelength region corresponding to blues and the wavelength region corresponding to greens and has three peaks in the wavelength region corresponding to reds. In contrast, the emission spectrum of the illumination device that includes the blue-yellow pseudo-white LEDs has peaks in the wavelength region corresponding to blues and the wavelength region corresponding to greens but does not have any peaks in the wavelength region corresponding to reds. This indicates that in the light emitted by the illumination device that includes the blue-yellow pseudo-white LEDs, the red component and the green component are not clearly separated. In contrast, in the light emitted by the illumination device 2 of the liquid crystal display device 100, the red component and the green component (and, of course, the blue component) are in fact clearly separated. Therefore, the color filter layers 22 in the liquid crystal display device 100 do not have to achieve as high a degree of color separation as in a conventional configuration (a liquid crystal display device equipped with an illumination device that includes blue-yellow pseudo-white LEDs). This makes it possible to maintain high transmittance in the color filter layers 22 even when adjusting the spectral transmission characteristics of the color filter layers 22 in order to achieve compliance with high color purity standards. This, in turn, makes it possible to improve the overall panel transmittance.

Figure 4:
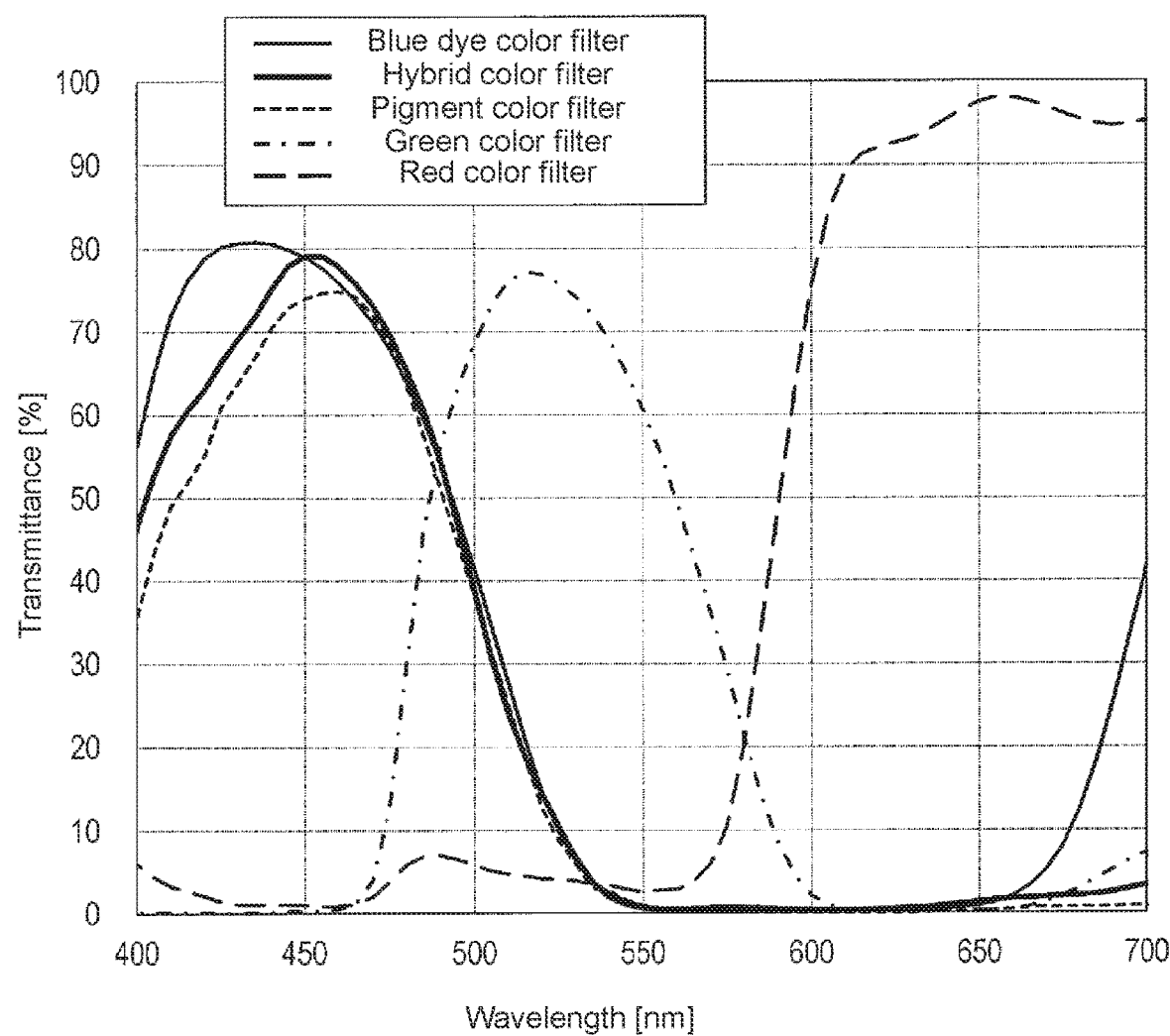
FIG. 4 is a graph showing examples of transmission spectrums of blue color filters 22B (dyed blue color filters 22B and hybrid blue color filters 22B) in the liquid crystal display device 100.

Moreover, the liquid crystal display device 100 includes the blue color filters 22B, which are made of a colored material that contains a dye. FIG. 4 shows examples of transmission spectrums of the blue color filters 22B. FIG. 4 shows two example spectrums: one for blue color filters that primarily contain a dye as the colorant (hereinafter, "dyed blue color filters") 22B and one for blue color filters that contain a non-negligible amount of a pigment in addition to a dye as colorants (hereinafter, "hybrid blue color filters") 22B. FIG. 4 also shows an example of the transmission spectrum of blue color filters that only contain a pigment as the colorant (hereinafter, "pigmented blue color filters") for comparison. In addition, FIG. 4 also shows examples of the transmission spectrums of the green color filters 22G and the red color filters 22R for reference.

As shown in FIG. 4, the dyed and hybrid blue color filters 22B exhibit higher transmittance than the pigmented blue color filters in the wavelength region corresponding to blues. Therefore, using the dyed or hybrid blue color filters 22B instead of the pigmented blue color filters significantly improves the panel transmittance.

Figure 5:
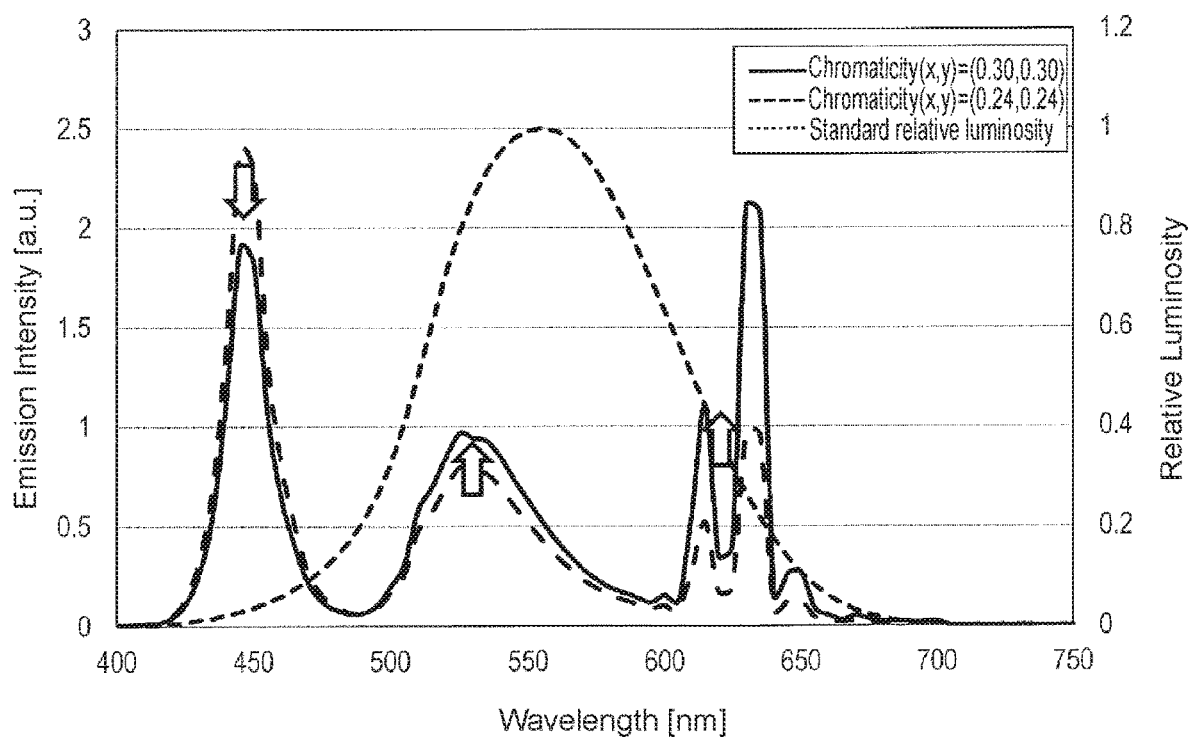
FIG. 5 is a graph showing a white light spectrum of chromaticity (x, y)=(0.30, 0.30) as an example of the emission spectrum of the illumination device 2.

Furthermore, in the liquid crystal display device 100, the chromaticity values x and y of the white light emitted from the illumination device 2 satisfy the relationships 0.24<x and 0.24<y. In other words, the chromaticity of the white light emitted from the illumination device 2 is shifted slightly more towards the yellow side than in conventional configurations. FIG. 5 shows a white light spectrum of chromaticity (x, y)=(0.30, 0.30) as an example of the emission spectrum of the illumination device 2 of the liquid crystal display device 100. FIG. 5 also shows a white light spectrum of chromaticity (x, y)=(0.24, 0.24) for comparison. Moreover, FIG. 5 also includes the standard luminosity function curve for reference.

As described above, the dyed and hybrid blue color filters 22B exhibit higher transmittance than the pigmented blue color filters. Therefore, increasing the amounts of the green phosphor 52 and the red phosphor 53 in the wavelength converter WC makes it possible to reduce the relative strength of the blue component while increasing the relative strength of the green and red components in the white light. This makes it possible to increase the brightness (total luminous flux) of the illumination device 2, thereby making it possible to increase the screen brightness of the liquid crystal display device 100 (note that here, photometric quantities such as luminous flux and brightness refer to the radiometric quantities (standard physical quantities) multiplied by the standard luminosity function).

As described above, the liquid crystal display device 100 exhibits excellent color reproduction and high panel transmittance. This makes it possible to increase brightness and reduce power consumption.

Note that although there is not a specific upper limit for the chromaticity values x and y of the white light emitted from the illumination device 2, from the perspective of avoiding an excessive increase in the thickness of the green color filters 22G, it is preferable that the chromaticity values x and y satisfy the relationships $x \leq 0.32$ and $y \leq 0.38$.

(Configuration of Dyed and Hybrid Blue Color Filters)

Dyed or hybrid color filters may be used for the blue color filters 22B. The dyed blue color filters 22B exhibit excellent transmittance, while the hybrid blue color filters 22B exhibit excellent durability, and therefore either the dyed or the hybrid blue color filters 22B may be selected as appropriate according to the desired specifications.

Triphenylmethane dyes can be preferably used as the dye contained in the colored material for forming the blue color filters 22B. Japanese Patent Application Laid-Open Publication No. 2010-243960, for example, discloses an example of a colored material that contains a triphenylmethane dye. Blue color filters made of the colored material disclosed in Japanese Patent Application Laid-Open Publication No. 2010-243960 exhibit high transmittance and excellent heat resistance. The entire contents of Japanese Patent Application Laid-Open Publication No. 2010-243960 are hereby incorporated by reference in the present specification.

Note that the dye is not limited to the triphenylmethane dyes described above. For example, azo dyes, anthraquinone dyes, methine dyes, triarylmethane dyes, xanthene dyes, and the like may be used as well.

Moreover, as described above in reference to the hybrid blue color filters 22B, the dye-containing colored material may further contain a pigment. Adding a pigment to the colored material in addition to the dye makes it possible to adjust the transmission characteristics and improve the durability of the blue color filters 22B, for example. Here, various well-known blue pigments can be used for the pigment.

Note that the dye contained in the colored material for the hybrid blue color filters 22B does not necessarily need to be a blue dye. For example, a colored material in which a small amount of a violet dye is added to a blue pigment (typically, less than or equal to 10 wt % relative to the blue pigment) in order to adjust the transmission characteristics may be used for the hybrid blue color filters 22B. Similarly, a colored material for the dyed blue color filters 22B may contain a small amount of a pigment (typically, less than or equal to 10 wt % relative to the dye) in order to adjust the transmission characteristics.

The colored materials used to form the red color filters 22R and the green color filters 22G are not particularly limited, and various well-known colored materials can be used.

(Configuration of Green Phosphor)

It is preferable that the peak wavelength of the emission spectrum (peak emission wavelength) of the green phosphor 52 be greater than or equal to 520 nm and less than or equal to 540 nm, more preferable that the peak emission wavelength be greater than or equal to 525 nm and less than or equal to 535 nm, and even more preferable that the peak emission wavelength be approximately 530 nm. Setting the peak emission wavelength of the green phosphor 52 in this way makes it possible to significantly improve screen brightness.

As shown in FIG. 5, the luminosity function has a maximum value near 555 nm. Therefore, simply speaking, and from the perspective of improving screen brightness, it would appear to be preferable that the peak emission wavelength of the green phosphor 52 be set to as near 555 nm as possible. However, testing conducted by the present inventors revealed that instead setting the peak emission wavelength of the green phosphor 52 to a value near 530 nm achieved a more significant improvement in screen brightness in the liquid crystal display device 100 according to the embodiment of the present invention. Next, the results of the present inventors' testing will be described.

In the simulation tests described below, the emission spectrum of the illumination device and the transmission spectrums of the color filter layers were set to make the color specifications of the liquid crystal display device compliant with the Adobe RGB standard. More specifically, the chromaticity values (Rx, Ry, Gx, Gy, Bx, and By) of the primary display colors red, green, and blue (that is, the colors respectively displayed by the red pixels, the green pixels, and the blue pixels) were adjusted to match the standard chromaticity values shown below in Table 1 as closely as possible.

TABLE 1

Standard Chromaticity Values

| Rx | Ry | Gx | Gy | Bx | By |
|---|---|---|---|---|---|
| 0.640 | 0.330 | 0.210 | 0.710 | 0.150 | 0.060 |

First, the test results for a case in which the liquid crystal layer in the liquid crystal display panel was made of a positive liquid crystal material will be described. This test was performed for Working Examples 1 to 12, Comparison Examples 1 to 6, and Reference Examples 1 and 2. Table 2 shows the specifications of these example display devices.

TABLE 2

| | Backlight | | |
|---|---|---|---|
| | Peak Emission Wavelength of Blue Light-Emitting Elements (nm) | Peak Emission Wavelength of Green Phosphor (nm) | Blue Color Filters |
| Comparison Example 1 | 440 | 530 | Pigmented |

TABLE 2-continued

| | Backlight | | |
|---|---|---|---|
| | Peak Emission Wavelength of Blue Light-Emitting Elements (nm) | Peak Emission Wavelength of Green Phosphor (nm) | Blue Color Filters |
| Working Example 1 | | | Hybrid |
| Working Example 2 | | | Dyed |
| Comparison Example 2 | | 535 | Pigmented |
| Working Example 3 | | | Hybrid |
| Working Example 4 | | | Dyed |
| Comparison Example 3 | | 540 | Pigmented |
| Working Example 5 | | | Hybrid |
| Working Example 6 | | | Dyed |
| Comparison Example 4 | 447 | 530 | Pigmented |
| Working Example 7 | | | Hybrid |
| Working Example 8 | | | Dyed |
| Comparison Example 5 | | 535 | Pigmented |
| Working Example 9 | | | Hybrid |
| Working Example 10 | | | Dyed |
| Comparison Example 6 | | 540 | Pigmented |
| Working Example 11 | | | Hybrid |
| Working Example 12 | | | Dyed |

TABLE 2-continued

| | Backlight | | |
|---|---|---|---|
| | Peak Emission Wavelength of Blue Light-Emitting Elements (nm) | Peak Emission Wavelength of Green Phosphor (nm) | Blue Color Filters |
| Reference Example 1 | Blue-yellow pseudo-white LEDs | | Pigmented |
| Reference Example 2 | | | |

As shown in Table 2, the peak emission wavelength of the blue light-emitting elements in the backlights in Working Examples 1 to 6 and Comparison Examples 1 to 3 was 440 nm, while the peak emission wavelength of the blue light-emitting elements in Working Examples 7 to 12 and Comparison Examples 4 to 6 was 447 nm. Moreover, the peak emission wavelength of the green phosphor in the backlight in Working Examples 1, 2, 7, and 8 and Comparison Examples 1 and 4 was 530 nm, while the peak emission wavelength of the green phosphor in Working Examples 3, 4, 9, and 10 and Comparison Examples 2 and 5 was 535 nm, and the peak emission wavelength of the green phosphor in Working Examples 5, 6, 11, and 12 and Comparison Examples 3 and 6 was 540 nm. Note that blue-yellow pseudo-white LEDs were used as the light source for the backlight in Reference Examples 1 and 2. Furthermore, as shown in Table 2, dyed or hybrid blue color filters were used in Working Examples 1 to 12, while pigmented blue color filters were used in Comparison Examples 1 to 6 and Reference Examples 1 and 2.

Table 3 shows the following data for each example: the chromaticity values (BLx and BLy) of the light emitted from the backlight; the chromaticity values (Rx, Ry, Gx, Gy, Bx, and By) of the red, green, and blue colors respectively displayed by the red pixels, the green pixels, and the blue pixels; and the chromaticity values (Wx and Wy) of the white color displayed by the color display pixels.

TABLE 3

| | BLx | BLy | Wx | Wy | Rx | Ry | Gx | Gy | Bx | By |
|---|---|---|---|---|---|---|---|---|---|---|
| Comparison Example 1 | 0.272 | 0.260 | 0.310 | 0.339 | 0.641 | 0.330 | 0.210 | 0.711 | 0.153 | 0.059 |
| Working Example 1 | 0.272 | 0.260 | 0.295 | 0.309 | 0.641 | 0.330 | 0.210 | 0.710 | 0.157 | 0.059 |
| Working Example 2 | 0.272 | 0.260 | 0.291 | 0.302 | 0.641 | 0.330 | 0.210 | 0.710 | 0.156 | 0.059 |
| Comparison Example 2 | 0.272 | 0.260 | 0.296 | 0.290 | 0.641 | 0.330 | 0.210 | 0.710 | 0.154 | 0.059 |
| Working Example 3 | 0.272 | 0.260 | 0.285 | 0.267 | 0.641 | 0.330 | 0.210 | 0.709 | 0.160 | 0.059 |
| Working Example 4 | 0.272 | 0.260 | 0.281 | 0.261 | 0.641 | 0.330 | 0.210 | 0.709 | 0.158 | 0.059 |
| Comparison Example 3 | 0.272 | 0.260 | 0.290 | 0.261 | 0.641 | 0.330 | 0.210 | 0.709 | 0.155 | 0.059 |
| Working Example 5 | 0.272 | 0.260 | 0.281 | 0.242 | 0.641 | 0.330 | 0.210 | 0.708 | 0.161 | 0.059 |
| Working Example 6 | 0.272 | 0.260 | 0.277 | 0.237 | 0.640 | 0.330 | 0.210 | 0.708 | 0.160 | 0.059 |
| Comparison Example 4 | 0.273 | 0.260 | 0.296 | 0.304 | 0.641 | 0.330 | 0.210 | 0.710 | 0.150 | 0.059 |
| Working Example 7 | 0.273 | 0.260 | 0.293 | 0.297 | 0.641 | 0.330 | 0.210 | 0.710 | 0.152 | 0.059 |
| Working Example 8 | 0.273 | 0.260 | 0.292 | 0.295 | 0.641 | 0.330 | 0.210 | 0.710 | 0.151 | 0.059 |
| Comparison Example 5 | 0.272 | 0.260 | 0.290 | 0.253 | 0.641 | 0.330 | 0.210 | 0.709 | 0.151 | 0.059 |

TABLE 3-continued

|  | BLx | BLy | Wx | Wy | Rx | Ry | Gx | Gy | Bx | By |
|---|---|---|---|---|---|---|---|---|---|---|
| Working Example 9 | 0.272 | 0.260 | 0.286 | 0.244 | 0.641 | 0.330 | 0.210 | 0.709 | 0.155 | 0.059 |
| Working Example 10 | 0.272 | 0.260 | 0.284 | 0.242 | 0.641 | 0.330 | 0.210 | 0.709 | 0.153 | 0.059 |
| Comparison Example 6 | 0.272 | 0.260 | 0.285 | 0.232 | 0.641 | 0.330 | 0.210 | 0.708 | 0.151 | 0.059 |
| Working Example 11 | 0.272 | 0.260 | 0.281 | 0.224 | 0.641 | 0.330 | 0.210 | 0.708 | 0.156 | 0.059 |
| Working Example 12 | 0.272 | 0.260 | 0.279 | 0.223 | 0.641 | 0.330 | 0.210 | 0.708 | 0.155 | 0.059 |
| Reference Example 1 | 0.287 | 0.270 | 0.285 | 0.254 | 0.641 | 0.330 | 0.210 | 0.709 | 0.151 | 0.059 |
| Reference Example 2 | 0.294 | 0.284 | 0.285 | 0.253 | 0.641 | 0.330 | 0.210 | 0.709 | 0.151 | 0.059 |

Table 4 shows the following data for each example: the NTSC ratio, the transmittance of the liquid crystal display panel (panel transmittance), the transmittance ratio relative to Reference Example 2 when the panel transmittance thereof is set to 100%, and a screen brightness index. Here, "screen brightness index" is a value calculated by multiplying the panel transmittance by the luminous flux of the backlight. In the present application, this screen brightness index serves as an indicator of the screen brightness of a liquid crystal display device. Moreover, during the testing a "white adjustment" process was performed in which, with the chromaticity values (BLx and BLy) of the light emitted from the backlights of Working Examples 1 to 12 and Comparison Examples 1 to 6 set to be substantially equal, the chromaticity values (Rx, Ry, Gx, Gy, Bx, and By) of the colors red, green, and blue were adjusted (by adjusting the transmission spectrums of the color filter layers), and then the chromaticity values (BLx and BLy) of the light emitted from the backlights were adjusted to eliminate discrepancies between the chromaticity values (Wx and Wy; see Table 3) of the color white. The screen brightness indices shown in Table 4 were calculated after this white adjustment. Furthermore, Table 5 shows the following data for after this white adjustment: the chromaticity values (BLx and BLy) of the light emitted from the backlights; the chromaticity values (Rx, Ry, Gx, Gy, Bx, and By) of the colors red, green, and blue; and the chromaticity values (Wx and Wy) of the color white.

TABLE 4

|  | NTSC Ratio | Panel Transmittance | Transmittance Ratio | Screen Brightness Index (after white adjustment) |
|---|---|---|---|---|
| Comparison Example 1 | 95.7% | 3.10% | 176.9% | 0.167 |
| Working Example 1 | 95.1% | 3.16% | 180.8% | 0.182 |
| Working Example 2 | 95.1% | 3.18% | 181.7% | 0.185 |
| Comparison Example 2 | 95.3% | 2.41% | 137.5% | 0.176 |
| Working Example 3 | 94.5% | 2.46% | 140.7% | 0.188 |
| Working Example 4 | 94.6% | 2.48% | 141.5% | 0.191 |
| Comparison Example 3 | 95.1% | 2.07% | 118.1% | 0.173 |
| Working Example 5 | 94.1% | 2.11% | 120.8% | 0.185 |
| Working Example 6 | 94.3% | 2.13% | 121.7% | 0.188 |
| Comparison Example 4 | 96.0% | 3.12% | 178.5% | 0.185 |
| Working Example 7 | 95.7% | 3.14% | 179.7% | 0.189 |
| Working Example 8 | 95.7% | 3.15% | 180.0% | 0.190 |
| Comparison Example 5 | 95.6% | 2.25% | 128.6% | 0.182 |
| Working Example 9 | 95.1% | 2.28% | 130.1% | 0.187 |
| Working Example 10 | 95.2% | 2.28% | 130.4% | 0.188 |
| Comparison Example 6 | 95.4% | 1.98% | 113.0% | 0.180 |
| Working Example 11 | 94.7% | 2.00% | 114.5% | 0.185 |
| Working Example 12 | 94.9% | 2.01% | 114.9% | 0.187 |
| Reference Example 1 | 95.5% | 1.74% | 99.2% | — |
| Reference Example 2 | 95.5% | 1.75% | 100.0% | — |

TABLE 5

| | After White Adjustment ||||||||||
|---|---|---|---|---|---|---|---|---|---|---|
|  | BLx | BLy | Wx | Wy | Rx | Ry | Gx | Gy | Bx | By |
| Comparison Example 1 | 0.265 | 0.244 | 0.302 | 0.322 | 0.640 | 0.329 | 0.210 | 0.708 | 0.153 | 0.055 |
| Working Example 1 | 0.280 | 0.275 | 0.302 | 0.322 | 0.643 | 0.331 | 0.210 | 0.712 | 0.156 | 0.064 |
| Working Example 2 | 0.283 | 0.281 | 0.302 | 0.322 | 0.644 | 0.331 | 0.210 | 0.712 | 0.155 | 0.066 |
| Comparison Example 2 | 0.281 | 0.295 | 0.302 | 0.322 | 0.640 | 0.335 | 0.211 | 0.714 | 0.153 | 0.070 |
| Working Example 3 | 0.291 | 0.319 | 0.302 | 0.322 | 0.641 | 0.336 | 0.211 | 0.717 | 0.159 | 0.079 |
| Working Example 4 | 0.294 | 0.324 | 0.302 | 0.322 | 0.643 | 0.336 | 0.211 | 0.717 | 0.157 | 0.082 |
| Comparison Example 3 | 0.290 | 0.327 | 0.302 | 0.322 | 0.638 | 0.340 | 0.212 | 0.718 | 0.153 | 0.082 |
| Working Example 5 | 0.297 | 0.347 | 0.302 | 0.322 | 0.638 | 0.341 | 0.212 | 0.720 | 0.162 | 0.091 |

TABLE 5-continued

| | After White Adjustment | | | | | | | | | |
|---|---|---|---|---|---|---|---|---|---|---|
| | BLx | BLy | Wx | Wy | Rx | Ry | Gx | Gy | Bx | By |
| Working Example 6 | 0.300 | 0.352 | 0.302 | 0.322 | 0.640 | 0.341 | 0.212 | 0.720 | 0.160 | 0.094 |
| Comparison Example 4 | 0.279 | 0.278 | 0.302 | 0.322 | 0.641 | 0.332 | 0.210 | 0.713 | 0.150 | 0.064 |
| Working Example 7 | 0.282 | 0.285 | 0.302 | 0.322 | 0.642 | 0.333 | 0.210 | 0.713 | 0.152 | 0.066 |
| Working Example 8 | 0.283 | 0.287 | 0.302 | 0.322 | 0.642 | 0.333 | 0.211 | 0.713 | 0.151 | 0.067 |
| Comparison Example 5 | 0.289 | 0.335 | 0.302 | 0.322 | 0.635 | 0.342 | 0.210 | 0.719 | 0.149 | 0.083 |
| Working Example 9 | 0.293 | 0.345 | 0.302 | 0.322 | 0.635 | 0.343 | 0.211 | 0.719 | 0.154 | 0.087 |
| Working Example 10 | 0.294 | 0.347 | 0.302 | 0.322 | 0.636 | 0.343 | 0.211 | 0.719 | 0.152 | 0.089 |
| Comparison Example 6 | 0.296 | 0.360 | 0.302 | 0.322 | 0.632 | 0.347 | 0.211 | 0.721 | 0.150 | 0.094 |
| Working Example 11 | 0.299 | 0.370 | 0.302 | 0.322 | 0.632 | 0.348 | 0.212 | 0.722 | 0.157 | 0.098 |
| Working Example 12 | 0.300 | 0.372 | 0.302 | 0.322 | 0.633 | 0.347 | 0.212 | 0.722 | 0.154 | 0.100 |
| Reference Example 1 | 0.287 | 0.270 | 0.285 | 0.254 | 0.641 | 0.330 | 0.210 | 0.709 | 0.151 | 0.059 |
| Reference Example 2 | 0.294 | 0.284 | 0.285 | 0.253 | 0.641 | 0.330 | 0.210 | 0.709 | 0.151 | 0.059 |

As shown in Table 4, Working Examples 1 to 12 exhibited higher panel transmittance than Reference Examples 1 and 2 (in which the backlights include blue-yellow pseudo-white LEDs as the light source). Moreover, in Table 4, comparing Working Examples 1 and 2 to Comparison Example 1, comparing Working Examples 3 and 4 to Comparison Example 2, comparing Working Examples 5 and 6 to Comparison Example 3, comparing Working Examples 7 and 8 to Comparison Example 4, comparing Working Examples 9 and 10 to Comparison Example 5, and comparing Working Examples 11 and 12 to Comparison Example 6 reveals that using dyed or hybrid blue color filters makes it possible to achieve higher panel transmittance and higher screen brightness indices than when using pigmented blue color filters.

Figure 6:
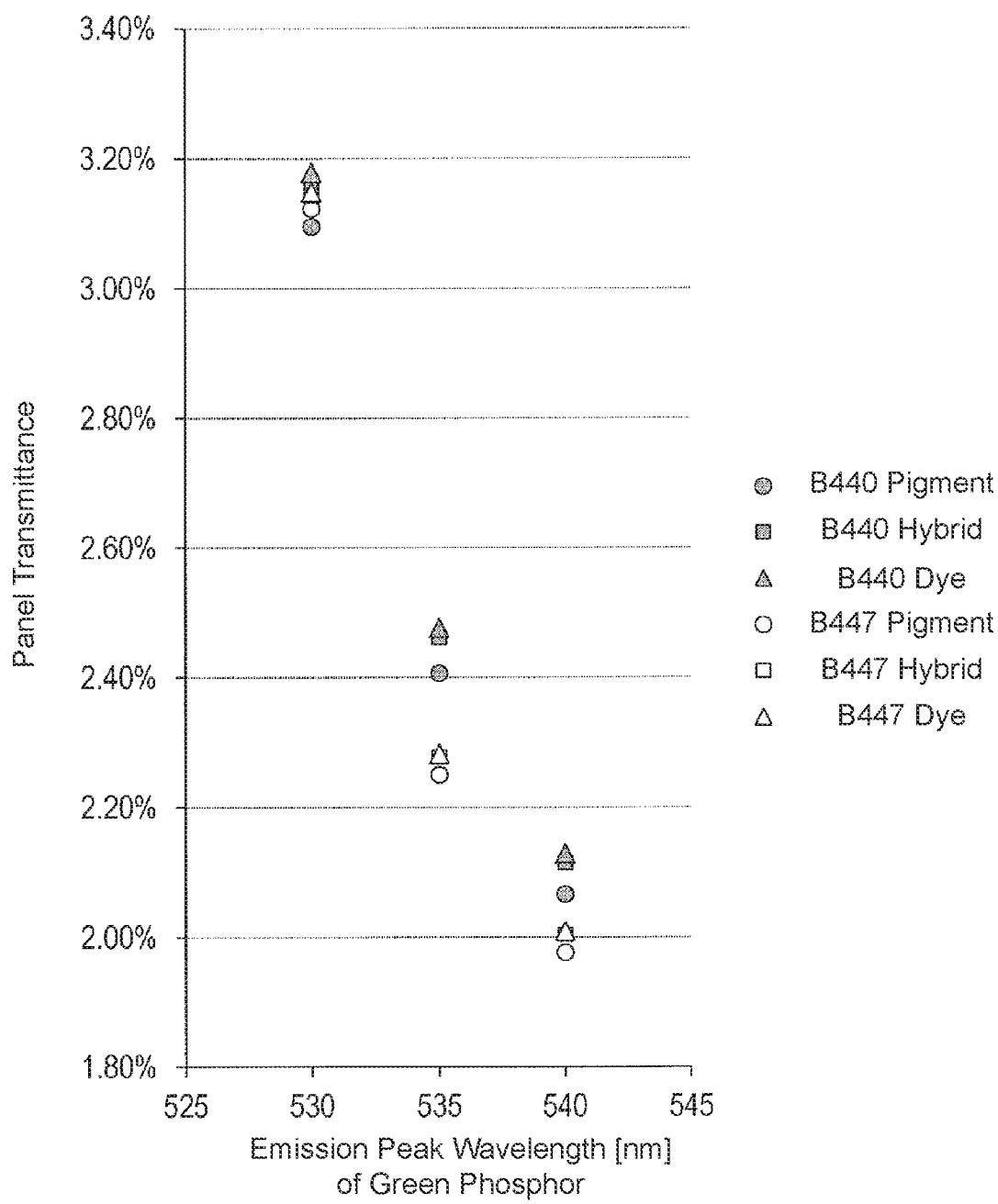
FIG. 6 is a graph that plots the panel transmittance values of Working Examples 1 to 12 and Comparison Examples 1 to 6 against the peak emission wavelength of a green phosphor on the horizontal axis.
Figure 7:
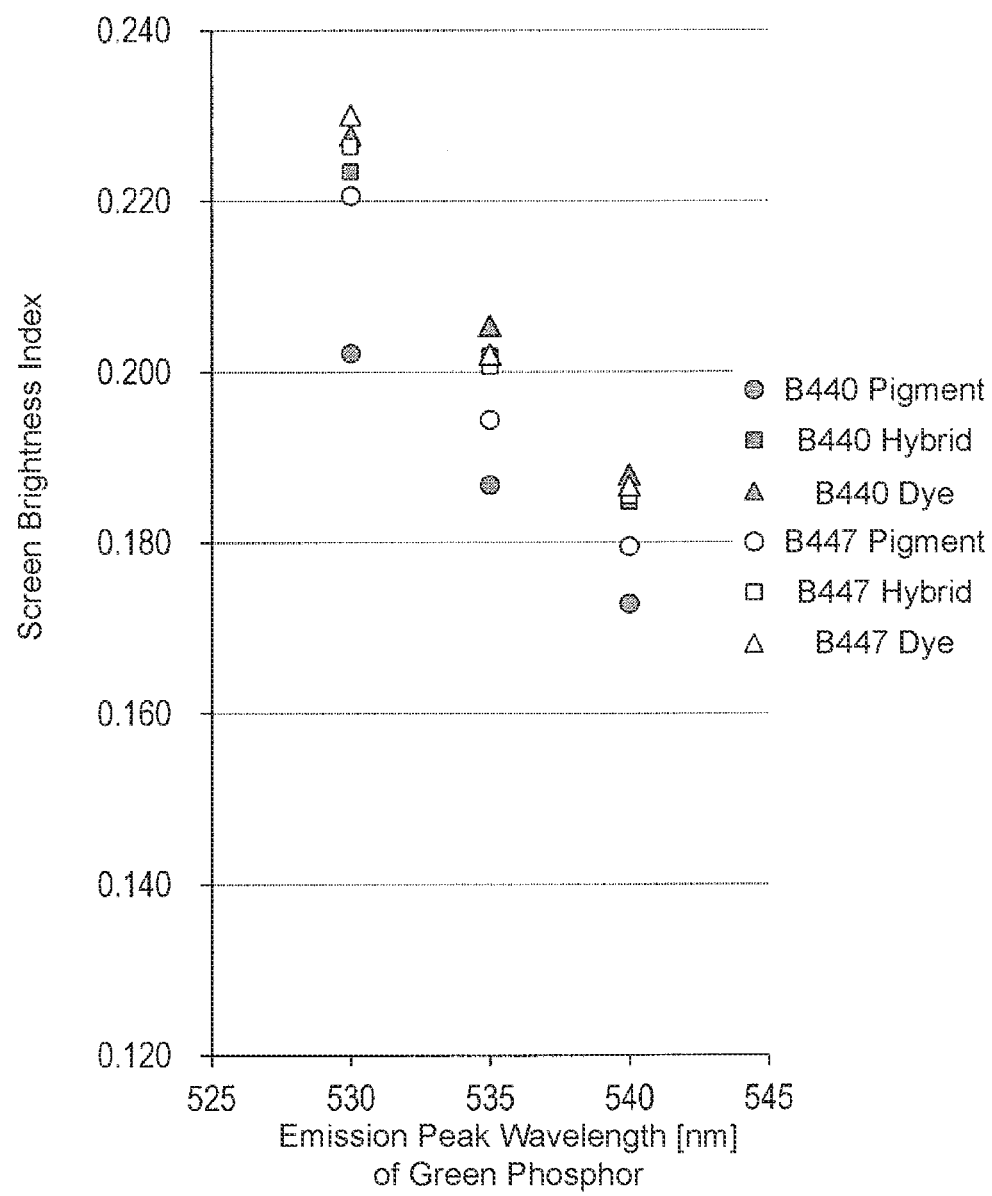
FIG. 7 is a graph that plots the screen brightness indices of Working Examples 1 to 12 and Comparison Examples 1 to 6 against the peak emission wavelength of the green phosphor on the horizontal axis.

FIG. 6 is a graph that plots the panel transmittance values of Working Examples 1 to 12 and Comparison Examples 1 to 6 against the peak emission wavelength of the green phosphor on the horizontal axis. FIG. 7 is a graph that plots the screen brightness indices of Working Examples 1 to 12 and Comparison Examples 1 to 6 against the peak emission wavelength of the green phosphor on the horizontal axis. In green phosphors, wavelength conversion efficiency varies as a function of emission wavelength, and therefore the screen brightness indices plotted in FIG. 7 were calculated using a fixed wavelength conversion efficiency. In FIGS. 6 and 7, the same type of point (labeled "B440 pigment") is used for Comparison Examples 1 to 3, and the same type of point (labeled "B447 pigment") is used for Comparison Examples 4 to 6. Moreover, the same type of point (labeled "B440 hybrid") is used for Working Examples 1, 3, and 5, and the same type of point (labeled "B447 hybrid") is used for Working Examples 7, 9, and 11. Similarly, the same type of point (labeled "B440 dye") is used for Working Examples 2, 4, and 6, and the same type of point (labeled "B447 dye") is used for Working Examples 8, 10, and 12.

As shown in FIGS. 6 and 7, using the dyed or hybrid blue color filters produces more improvement in panel transmittance and screen brightness index than does using pigmented blue color filters. As also shown in FIGS. 6 and 7, setting the peak emission wavelength of the green phosphor to 535 nm makes it possible to achieve a higher panel transmittance and screen brightness index than a peak emission wavelength of 540 nm, while a peak emission wavelength of 530 nm makes it possible to achieve an even higher panel transmittance and screen brightness index than the peak emission wavelength of 535 nm.

Next, the test results for a case in which the liquid crystal layer in the liquid crystal display panel was made of a negative liquid crystal material will be described. This test was performed for Working Examples 13 to 24, Comparison Examples 7 to 12, and Reference Examples 3 and 4. Table 6 shows the specifications of these example display devices.

TABLE 6

| | Backlight | | |
|---|---|---|---|
| | Peak Emission Wavelength of Blue Light-Emitting Elements (nm) | Peak Emission Wavelength of Green Phosphor (nm) | Blue Color Filters |
| Comparison Example 7 | 440 | 530 | Pigmented |
| Working Example 13 | | | Hybrid |
| Working Example 14 | | | Dyed |
| Comparison Example 8 | | 535 | Pigmented |
| Working Example 15 | | | Hybrid |
| Working Example 16 | | | Dyed |
| Comparison Example 9 | | 540 | Pigmented |
| Working Example 17 | | | Hybrid |
| Working Example 18 | | | Dyed |
| Comparison Example 10 | 447 | 530 | Pigmented |

TABLE 6-continued

| | Backlight | | |
|---|---|---|---|
| | Peak Emission Wavelength of Blue Light-Emitting Elements (nm) | Peak Emission Wavelength of Green Phosphor (nm) | Blue Color Filters |
| Working Example 19 | | | Hybrid |
| Working Example 20 | | | Dyed |
| Comparison Example 11 | | 535 | Pigmented |
| Working Example 21 | | | Hybrid |
| Working Example 22 | | | Dyed |
| Comparison Example 12 | | 540 | Pigmented |
| Working Example 23 | | | Hybrid |
| Working Example 24 | | | Dyed |
| Reference Example 3 | Blue-yellow pseudo-white LEDs | | Pigmented |
| Reference Example 4 | | | |

As shown in Table 6, the peak emission wavelength of the blue light-emitting elements in the backlights in Working Examples 13 to 18 and Comparison Examples 7 to 9 was 440 nm, while the peak emission wavelength of the blue light-emitting elements in Working Examples 19 to 24 and Comparison Examples 10 to 12 was 447 nm. Moreover, the peak emission wavelength of the green phosphor in the backlight in Working Examples 13, 14, 19, and 20 and Comparison Examples 7 and 11 was 530 nm, while the peak emission wavelength of the green phosphor in Working Examples 15, 16, 21, and 22 and Comparison Examples 8 and 11 was 535 nm, and the peak emission wavelength of the green phosphor in Working Examples 17, 18, 23, and 24 and Comparison Examples 9 and 12 was 540 nm. Note that blue-yellow pseudo-white LEDs were used as the light source for the backlight in Reference Examples 3 and 4. Furthermore, as shown in Table 6, dyed or hybrid blue color filters were used in Working Examples 13 to 24, while pigmented blue color filters were used in Comparison Examples 7 to 12 and Reference Examples 3 and 4.

Table 7 shows the following data for each example: the chromaticity values (BLx and BLy) of the light emitted from the backlight; the chromaticity values (Rx, Ry, Gx, Gy, Bx, and By) of the red, green, and blue colors respectively displayed by the red pixels, the green pixels, and the blue pixels; and the chromaticity values (Wx and Wy) of the white color displayed by the color display pixels.

TABLE 7

| | BLx | BLy | Wx | Wy | Rx | Ry | Gx | Gy | Bx | By |
|---|---|---|---|---|---|---|---|---|---|---|
| Comparison Example 7 | 0.272 | 0.260 | 0.314 | 0.337 | 0.642 | 0.331 | 0.210 | 0.711 | 0.153 | 0.059 |
| Working Example 13 | 0.272 | 0.260 | 0.299 | 0.307 | 0.642 | 0.330 | 0.210 | 0.711 | 0.157 | 0.059 |
| Working Example 14 | 0.272 | 0.260 | 0.295 | 0.301 | 0.642 | 0.330 | 0.210 | 0.711 | 0.156 | 0.059 |
| Comparison Example 8 | 0.272 | 0.260 | 0.300 | 0.288 | 0.642 | 0.330 | 0.210 | 0.710 | 0.154 | 0.059 |
| Working Example 15 | 0.272 | 0.260 | 0.289 | 0.266 | 0.641 | 0.330 | 0.210 | 0.710 | 0.160 | 0.059 |
| Working Example 16 | 0.272 | 0.260 | 0.285 | 0.260 | 0.641 | 0.330 | 0.210 | 0.710 | 0.159 | 0.059 |
| Comparison Example 9 | 0.272 | 0.260 | 0.294 | 0.260 | 0.642 | 0.330 | 0.210 | 0.710 | 0.155 | 0.059 |
| Working Example 17 | 0.272 | 0.260 | 0.285 | 0.241 | 0.641 | 0.330 | 0.210 | 0.709 | 0.162 | 0.059 |
| Working Example 18 | 0.272 | 0.260 | 0.281 | 0.236 | 0.641 | 0.330 | 0.210 | 0.709 | 0.160 | 0.059 |
| Comparison Example 10 | 0.273 | 0.260 | 0.301 | 0.304 | 0.642 | 0.330 | 0.210 | 0.711 | 0.150 | 0.059 |
| Working Example 19 | 0.273 | 0.260 | 0.298 | 0.297 | 0.642 | 0.330 | 0.210 | 0.711 | 0.152 | 0.059 |
| Working Example 20 | 0.273 | 0.260 | 0.296 | 0.295 | 0.642 | 0.330 | 0.210 | 0.711 | 0.151 | 0.059 |
| Comparison Example 11 | 0.272 | 0.260 | 0.294 | 0.257 | 0.642 | 0.330 | 0.210 | 0.710 | 0.151 | 0.059 |
| Working Example 21 | 0.272 | 0.260 | 0.290 | 0.248 | 0.642 | 0.330 | 0.210 | 0.710 | 0.155 | 0.059 |
| Working Example 22 | 0.272 | 0.260 | 0.288 | 0.246 | 0.641 | 0.330 | 0.210 | 0.710 | 0.153 | 0.059 |
| Comparison Example 12 | 0.272 | 0.260 | 0.289 | 0.234 | 0.642 | 0.330 | 0.210 | 0.709 | 0.151 | 0.059 |
| Working Example 23 | 0.272 | 0.260 | 0.286 | 0.226 | 0.642 | 0.330 | 0.210 | 0.709 | 0.156 | 0.059 |
| Working Example 24 | 0.272 | 0.260 | 0.283 | 0.224 | 0.642 | 0.330 | 0.210 | 0.709 | 0.155 | 0.059 |
| Reference Example 3 | 0.287 | 0.270 | 0.284 | 0.246 | 0.641 | 0.330 | 0.210 | 0.709 | 0.151 | 0.059 |
| Reference Example 4 | 0.294 | 0.284 | 0.287 | 0.251 | 0.641 | 0.330 | 0.210 | 0.709 | 0.151 | 0.059 |

Table 8 shows the following data for each example: the NTSC ratio, the panel transmittance, the transmittance ratio relative to Reference Example 3 when the panel transmittance thereof is set to 100%, and the screen brightness index. Note that the screen brightness indices shown in Table 8 were calculated after this white adjustment. Moreover, Table 9 shows the following data for after this white adjustment: the chromaticity values (BLx and BLy) of the light emitted from the backlights; the chromaticity values (Rx, Ry, Gx, Gy, Bx, and By) of the colors red, green, and blue; and the chromaticity values (Wx and Wy) of the color white.

TABLE 8

|  | NTSC Ratio | Panel Transmittance | Transmittance Ratio | Screen Brightness Index (after white adjustment) |
| --- | --- | --- | --- | --- |
| Comparison Example 7 | 95.9% | 3.30% | 176.4% | 0.178 |
| Working Example 13 | 95.2% | 3.37% | 180.2% | 0.194 |
| Working Example 14 | 95.3% | 3.39% | 181.1% | 0.197 |

TABLE 8-continued

|  | NTSC Ratio | Panel Transmittance | Transmittance Ratio | Screen Brightness Index (after white adjustment) |
| --- | --- | --- | --- | --- |
| Comparison Example 8 | 95.5% | 2.57% | 137.2% | 0.188 |
| Working Example 15 | 94.7% | 2.63% | 140.3% | 0.202 |
| Working Example 16 | 94.9% | 2.64% | 141.2% | 0.205 |
| Comparison Example 9 | 95.3% | 2.21% | 118.0% | 0.185 |
| Working Example 17 | 94.4% | 2.26% | 120.7% | 0.197 |
| Working Example 18 | 94.5% | 2.28% | 121.5% | 0.201 |
| Comparison Example 10 | 96.2% | 3.38% | 177.8% | 0.197 |
| Working Example 19 | 95.9% | 3.35% | 179.0% | 0.201 |
| Working Example 20 | 96.0% | 3.36% | 179.3% | 0.202 |
| Comparison Example 11 | 95.9% | 2.47% | 131.7% | 0.197 |
| Working Example 21 | 95.4% | 2.50% | 133.2% | 0.203 |
| Working Example 22 | 95.5% | 2.50% | 133.5% | 0.204 |
| Comparison Example 12 | 95.7% | 2.13% | 113.9% | 0.192 |
| Working Example 23 | 95.1% | 2.16% | 115.4% | 0.199 |
| Working Example 24 | 95.2% | 2.17% | 115.7% | 0.200 |
| Reference Example 3 | 95.7% | 1.87% | 100.0% | — |
| Reference Example 4 | 95.8% | 1.87% | 99.8% | — |

TABLE 9

| | After White Adjustment | | | | | | | | | |
| --- | --- | --- | --- | --- | --- | --- | --- | --- | --- | --- |
| | BLx | BLy | Wx | Wy | Rx | Ry | Gx | Gy | Bx | By |
| Comparison Example 7 | 0.261 | 0.243 | 0.300 | 0.320 | 0.637 | 0.331 | 0.210 | 0.708 | 0.153 | 0.054 |
| Working Example 13 | 0.275 | 0.274 | 0.300 | 0.320 | 0.641 | 0.332 | 0.210 | 0.712 | 0.156 | 0.063 |
| Working Example 14 | 0.278 | 0.281 | 0.300 | 0.320 | 0.642 | 0.333 | 0.210 | 0.713 | 0.155 | 0.066 |
| Comparison Example 8 | 0.277 | 0.295 | 0.300 | 0.320 | 0.637 | 0.337 | 0.211 | 0.715 | 0.153 | 0.070 |
| Working Example 15 | 0.287 | 0.319 | 0.300 | 0.320 | 0.639 | 0.338 | 0.211 | 0.717 | 0.159 | 0.079 |
| Working Example 16 | 0.290 | 0.324 | 0.300 | 0.320 | 0.640 | 0.338 | 0.211 | 0.718 | 0.157 | 0.082 |
| Comparison Example 9 | 0.286 | 0.327 | 0.300 | 0.320 | 0.635 | 0.342 | 0.212 | 0.718 | 0.153 | 0.082 |
| Working Example 17 | 0.293 | 0.347 | 0.300 | 0.320 | 0.636 | 0.343 | 0.212 | 0.720 | 0.162 | 0.091 |
| Working Example 18 | 0.296 | 0.352 | 0.300 | 0.320 | 0.637 | 0.343 | 0.212 | 0.721 | 0.160 | 0.094 |
| Comparison Example 10 | 0.273 | 0.276 | 0.300 | 0.320 | 0.639 | 0.334 | 0.210 | 0.713 | 0.150 | 0.063 |
| Working Example 19 | 0.277 | 0.283 | 0.300 | 0.320 | 0.639 | 0.334 | 0.210 | 0.714 | 0.152 | 0.066 |
| Working Example 20 | 0.278 | 0.286 | 0.300 | 0.320 | 0.640 | 0.334 | 0.210 | 0.714 | 0.151 | 0.067 |
| Comparison Example 11 | 0.285 | 0.329 | 0.300 | 0.320 | 0.633 | 0.343 | 0.211 | 0.719 | 0.149 | 0.081 |
| Working Example 21 | 0.288 | 0.339 | 0.300 | 0.320 | 0.633 | 0.344 | 0.211 | 0.719 | 0.154 | 0.085 |
| Working Example 22 | 0.290 | 0.341 | 0.300 | 0.320 | 0.634 | 0.344 | 0.211 | 0.720 | 0.152 | 0.086 |
| Comparison Example 12 | 0.292 | 0.358 | 0.300 | 0.320 | 0.630 | 0.349 | 0.211 | 0.722 | 0.150 | 0.092 |
| Working Example 23 | 0.294 | 0.368 | 0.300 | 0.320 | 0.629 | 0.350 | 0.211 | 0.722 | 0.157 | 0.097 |
| Working Example 24 | 0.296 | 0.369 | 0.300 | 0.320 | 0.630 | 0.349 | 0.212 | 0.722 | 0.154 | 0.098 |
| Reference Example 3 | 0.287 | 0.270 | 0.284 | 0.246 | 0.641 | 0.330 | 0.210 | 0.709 | 0.151 | 0.059 |
| Reference Example 4 | 0.294 | 0.284 | 0.287 | 0.251 | 0.641 | 0.330 | 0.210 | 0.709 | 0.151 | 0.059 |

As shown in Table 8, Working Examples 13 to 24 exhibited higher panel transmittance than Reference Examples 3 and 4 (in which the backlights include blue-yellow pseudo-white LEDs as the light source). Moreover, in Table 8, comparing Working Examples 13 and 14 to Comparison Example 7, comparing Working Examples 15 and 16 to Comparison Example 8, comparing Working Examples 17 and 18 to Comparison Example 9, comparing Working Examples 19 and 20 to Comparison Example 10, comparing Working Examples 21 and 22 to Comparison Example 11, and comparing Working Examples 23 and 24 to Comparison Example 12 reveals that using dyed or hybrid blue color filters makes it possible to achieve higher panel transmittance and higher screen brightness indices than when using pigmented blue color filters.

Figure 8:
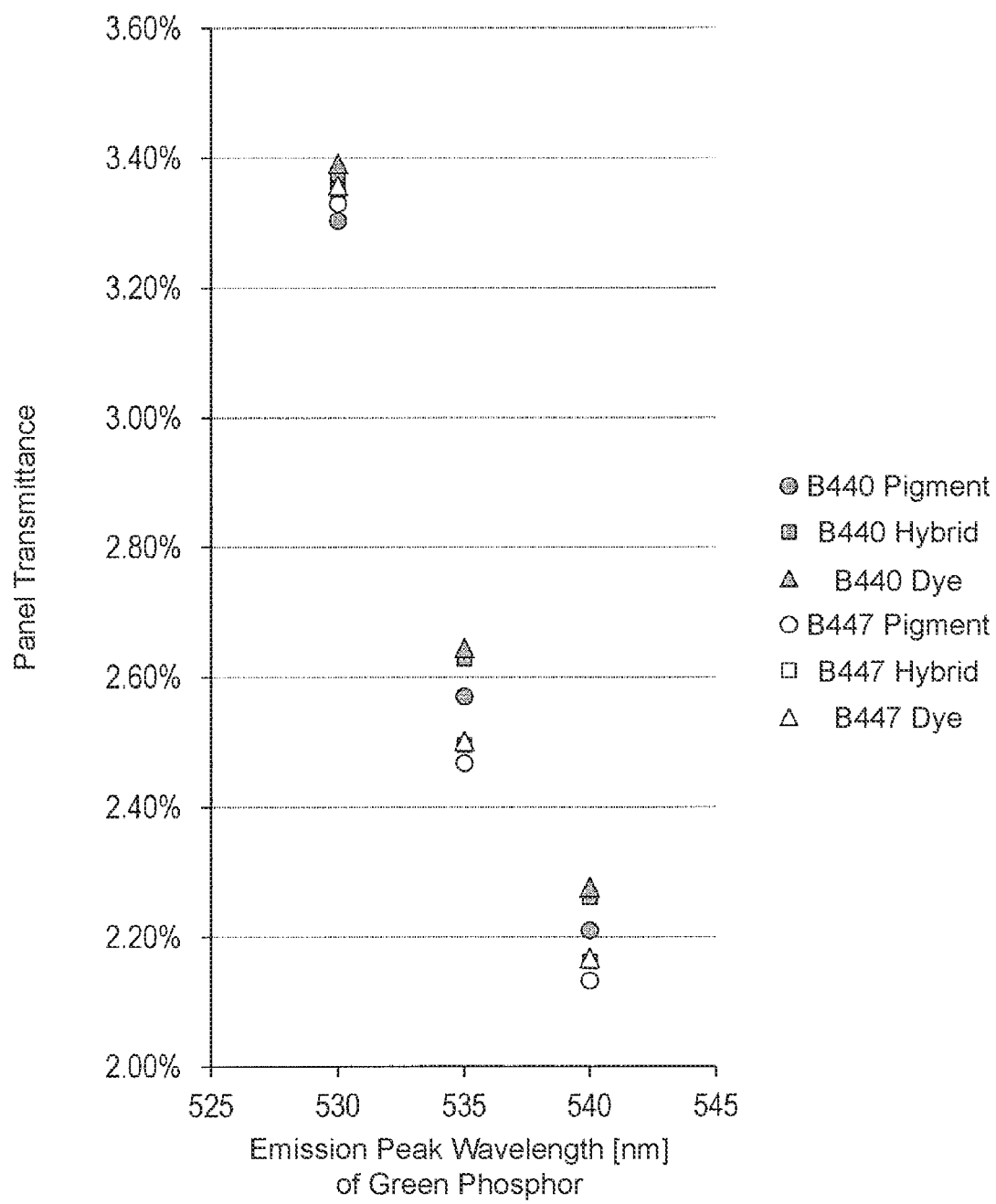
FIG. 8 is a graph that plots the panel transmittance values of Working Examples 13 to 24 and Comparison Examples 7 to 12 against the peak emission wavelength of a green phosphor on the horizontal axis.
Figure 9:
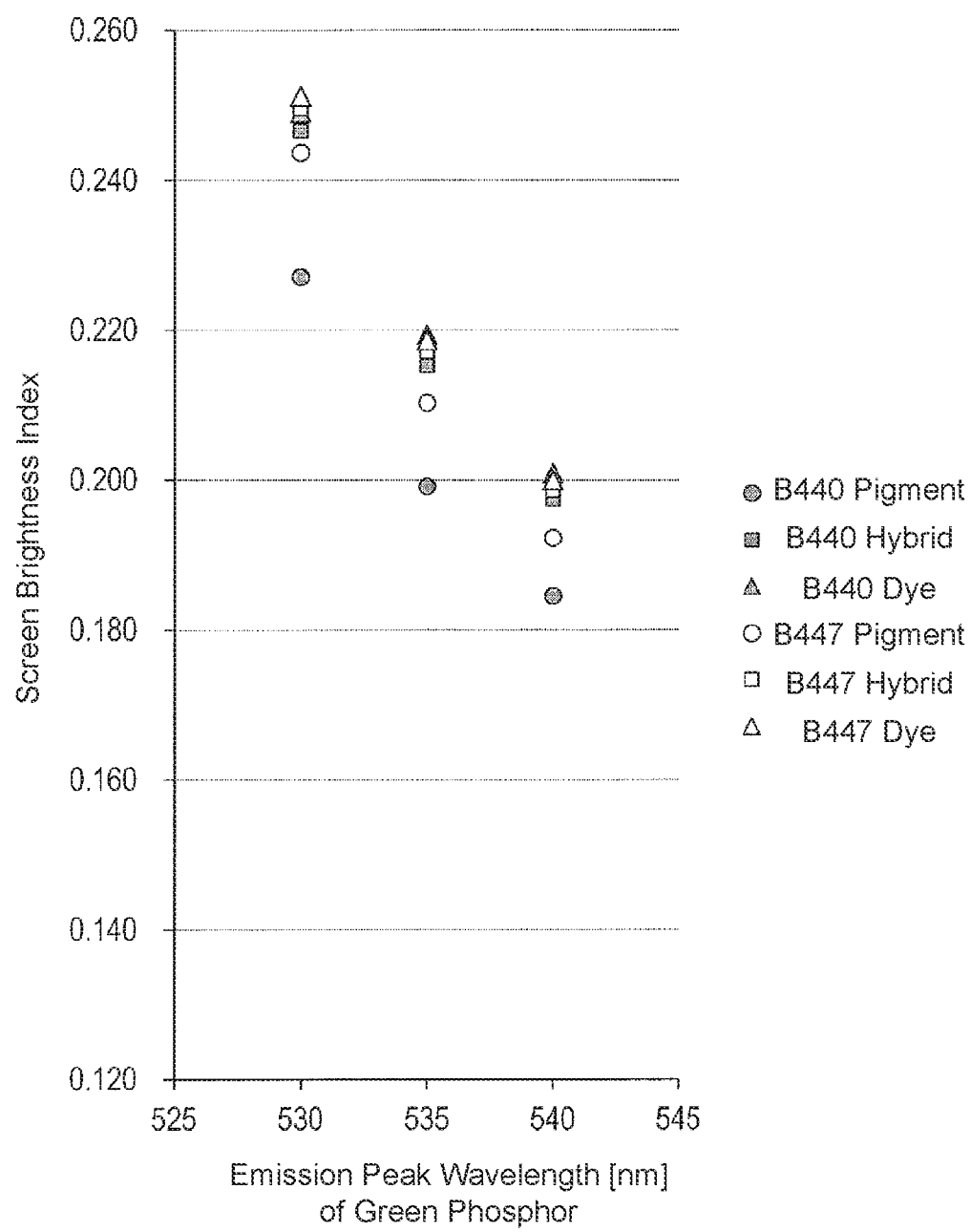
FIG. 9 is a graph that plots the screen brightness indices of Working Examples 13 to 24 and Comparison Examples 7 to 12 against the peak emission wavelength of the green phosphor on the horizontal axis.

FIG. 8 is a graph that plots the panel transmittance values of Working Examples 13 to 24 and Comparison Examples 7 to 12 against the peak emission wavelength of the green phosphor on the horizontal axis. FIG. 9 is a graph that plots the screen brightness indices of Working Examples 13 to 24 and Comparison Examples 7 to 12 against the peak emission wavelength of the green phosphor on the horizontal axis. In green phosphors, wavelength conversion efficiency varies as a function of emission wavelength, and therefore the screen brightness indices plotted in FIG. 9 were calculated using a fixed wavelength conversion efficiency. In FIGS. 8 and 9, the same type of point (labeled "B440 pigment") is used for Comparison Examples 7 to 9, and the same type of point (labeled "B447 pigment") is used for Comparison Examples 10 to 12. Moreover, the same type of point (labeled "B440 hybrid") is used for Working Examples 13, 15, and 17, and the same type of point (labeled "B447 hybrid") is used for Working Examples 19, 21, and 23. Similarly, the same type of point (labeled "B440 dye") is used for Working Examples 14, 16, and 18, and the same type of point (labeled "B447 dye") is used for Working Examples 20, 22, and 24.

As shown in FIGS. 8 and 9, using the dyed or hybrid blue color filters produces more improvement in panel transmittance and screen brightness index than does using pigmented blue color filters. As also shown in FIGS. 8 and 9, setting the peak emission wavelength of the green phosphor to 535 nm makes it possible to achieve a higher panel transmittance and screen brightness index than a peak emission wavelength of 540 nm, while a peak emission wavelength of 530 nm makes it possible to achieve an even higher panel transmittance and screen brightness index than the peak emission wavelength of 535 nm.

As shown in the test results above, setting the peak emission wavelength of the green phosphor 52 to a value near 530 nm (specifically, to a value of greater than or equal to 520 nm and less than or equal to 540 nm, where it is preferable that the value be greater than or equal to 525 nm and less than or equal to 535 nm, and more preferable that the value be approximately 530 nm) makes it possible to significantly improve screen brightness.

A bivalent europium-activated oxynitride β-SiAlON phosphor in which the theoretical composition can be represented by the general formula (A): $Si_{6-z}Al_zO_zN_{8-z}:Eu_x$ (where z and x satisfy the relationships $0<z<4.2$ and $0.003<x<0.03$) can be preferably used as a green phosphor 52 that has a peak emission wavelength of greater than or equal to 520 nm and less than or equal to 540 nm. For example, a compound with a composition of $Si_{5.94}Al_{0.06}O_{0.06}N_{7.94}:Eu_{0.014}$ has a peak emission wavelength of approximately 530 nm, while a compound with a composition of $Si_{5.975}Al_{0.0025}O_{0.025}N_{7.975}:Eu_{0.014}$ has a peak emission wavelength of approximately 525 nm, a compound with a composition of $Si_{5.9}Al_{0.1}O_{0.1}N_{7.9}:Eu_{0.014}$ has a peak emission wavelength of approximately 535 nm, and a compound with a composition of $Si_{5.77}Al_{0.23}O_{0.23}N_{7.77}:Eu_{0.014}$ has a peak emission wavelength of approximately 540 nm.

In green phosphors 52 of the type described above, the composition of the actual phosphor may sometimes be different than the theoretical composition (the composition represented by general formula (A)) due to the manufacturing process used or to the effects of residual oxygen contained in the raw material powders, for example. More specifically, green phosphors 52 that have a peak emission wavelength of less than or equal to 535 nm exhibit a more significant difference between the theoretical composition and the composition of the actual phosphor, with the actual oxygen concentration tending to be higher than the theoretical value in the general formula (A). Therefore, for green phosphors 52 with a peak emission wavelength of less than or equal to 535 nm, the peak emission wavelength may be defined according to the actual oxygen concentration of the phosphor rather than according to general formula (A). For example, for green phosphors 52 of the type described above, those with a measured oxygen concentration of less than 0.4 wt % in the crystalline phosphor material have a peak emission wavelength of less than or equal to 525 nm, while those with a measured oxygen concentration of greater than or equal to 0.4 wt % and less than 0.5 wt % have a peak emission wavelength of less than or equal to 530 nm, and those with a measured oxygen concentration of greater than or equal to 0.5 wt % and less than or equal to 0.8 wt % have a peak emission wavelength of less than or equal to 535 nm.

Note, however, that the peak emission wavelength of the green phosphor 52 does not necessarily have to be greater than or equal to 520 nm and less than or equal to 540 nm, and the composition of the green phosphor 52 is not limited the specific example given above. For example, the green phosphor disclosed in WO 2009/110285, the green phosphor disclosed in WO 2007/066733 or Japanese Patent Application Laid-Open Publication No. 2008-303331, one of the green sulfide phosphors disclosed in Japanese Patent Application Laid-Open Publication No. 2004-327492 (such as $SrGa_2S_4:Eu$), or the like may be used. The entire contents of WO 2009/110285, WO 2007/066733, Japanese Patent Application Laid-Open Publication No. 2008-303331, and Japanese Patent Application Laid-Open Publication No. 2004-327492 are hereby incorporated by reference in the present specification.

(Configuration of Red Phosphor)

Figure 10:
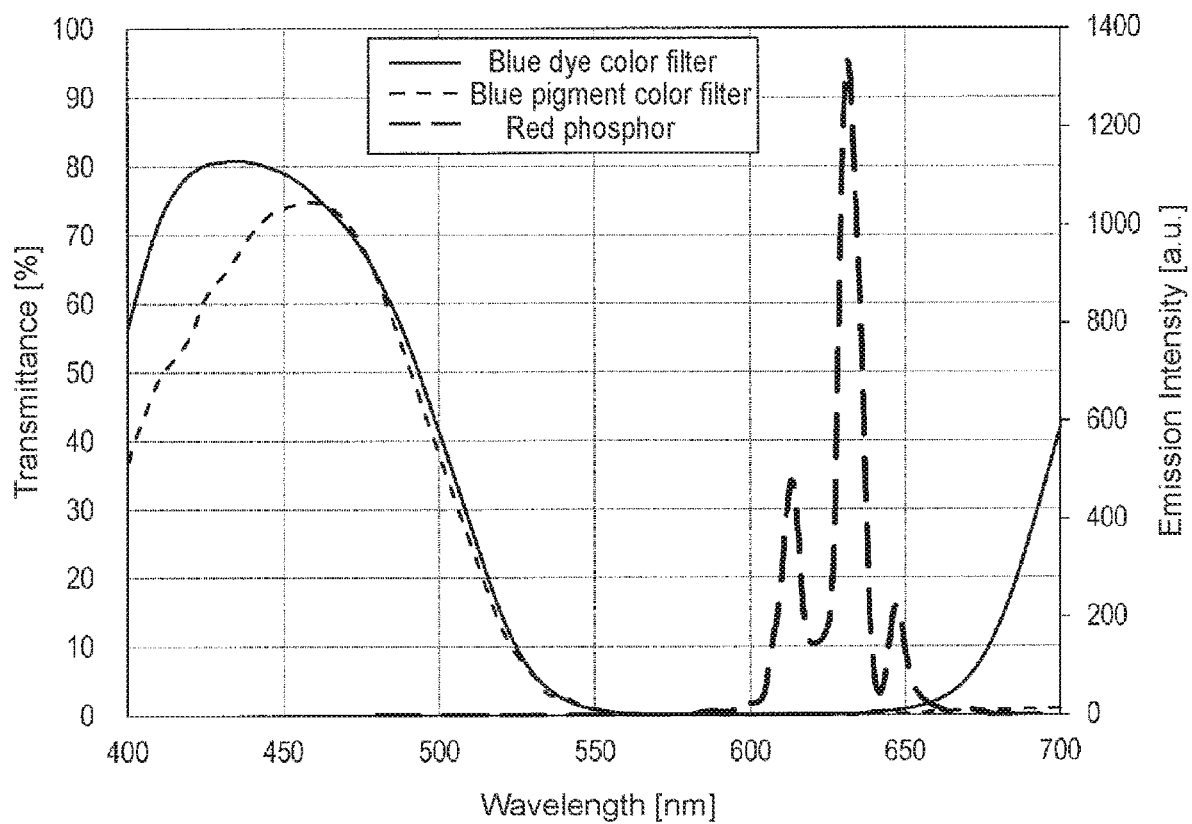
FIG. 10 is a graph showing examples of the transmission spectrum of the dyed blue color filters 22B, the transmission spectrum of pigmented blue color filters, and the transmission spectrum of a red phosphor 53.

FIG. 10 shows an example of the transmission spectrum of the dyed blue color filters 22B and an example of the transmission spectrum of the pigmented blue color filters. As shown in FIG. 10, the dyed blue color filters 22B exhibit higher transmittance than the pigmented blue color filters in the wavelength region corresponding to blues and also exhibit lower transmittance to the pigmented blue color filters in the wavelength region of 550 nm to 650 nm. However, as also shown in FIG. 10, the transmittance of the dyed blue color filters 22B begins to increase rapidly in the wavelength region of 650 nm and greater.

Therefore, it is preferable that the emission spectrum of the red phosphor 53 have a low spectral intensity at wavelengths of greater than or equal to 650 nm, as in the case shown in FIG. 10. More specifically, it is preferable that the ratio Ia/Ib of the emission spectrum of the red phosphor 53, where Ia is the integrated intensity at wavelengths greater than or equal to 650 nm and Ib is the integrated intensity over all wavelength regions, be less than 0.1.

A tetravalent manganese-activated tetravalent metal fluoride salt phosphor that can be represented by the general formula (B): $M^I_2(M^{II}_{1-h}Mn_h)F_6$ (where $M^I$ is at least one alkali metal element selected from a group consisting of Li, Na, K, Rb, and Cs; $M^{II}$ is at least one tetravalent element selected from a group consisting of Ge, Si, Sn, Ti, and Zr; and h satisfies the relationship 0.01<h<0.2) can be preferably used as a red phosphor 53 for which the ratio Ia/Ib is less than 0.1. For example, the compound $K_2(Si_{0.950}Mn_{0.050})F_6$ has an Ia/Ib ratio of approximately 0.035.

Note, however, that the ratio Ia/Ib does not necessarily have to be less than 0.1, and the red phosphor 53 is not limited to the specific example given above. For example, the red phosphor disclosed in WO 2009/110285 or the red phosphor disclosed in Japanese Patent Application Laid-Open Publication No. 2010-93132 may be used. The entire contents of Japanese Patent Application Laid-Open Publication No. 2010-93132 are hereby incorporated by reference in the present specification.

The mixture ratio of the green phosphor 52 and the red phosphor 53 is not particularly limited, but it is preferable that the mixture ratio be set such that the weight ratio of the green phosphor 52 relative to the red phosphor 53 is 5% to 70% and more preferable that the mixture ratio be set such that this weight ratio is 15% to 45%.

<Color Specifications for Supporting Deeper Colors than in the Adobe RGB Standard>

Figure 21:
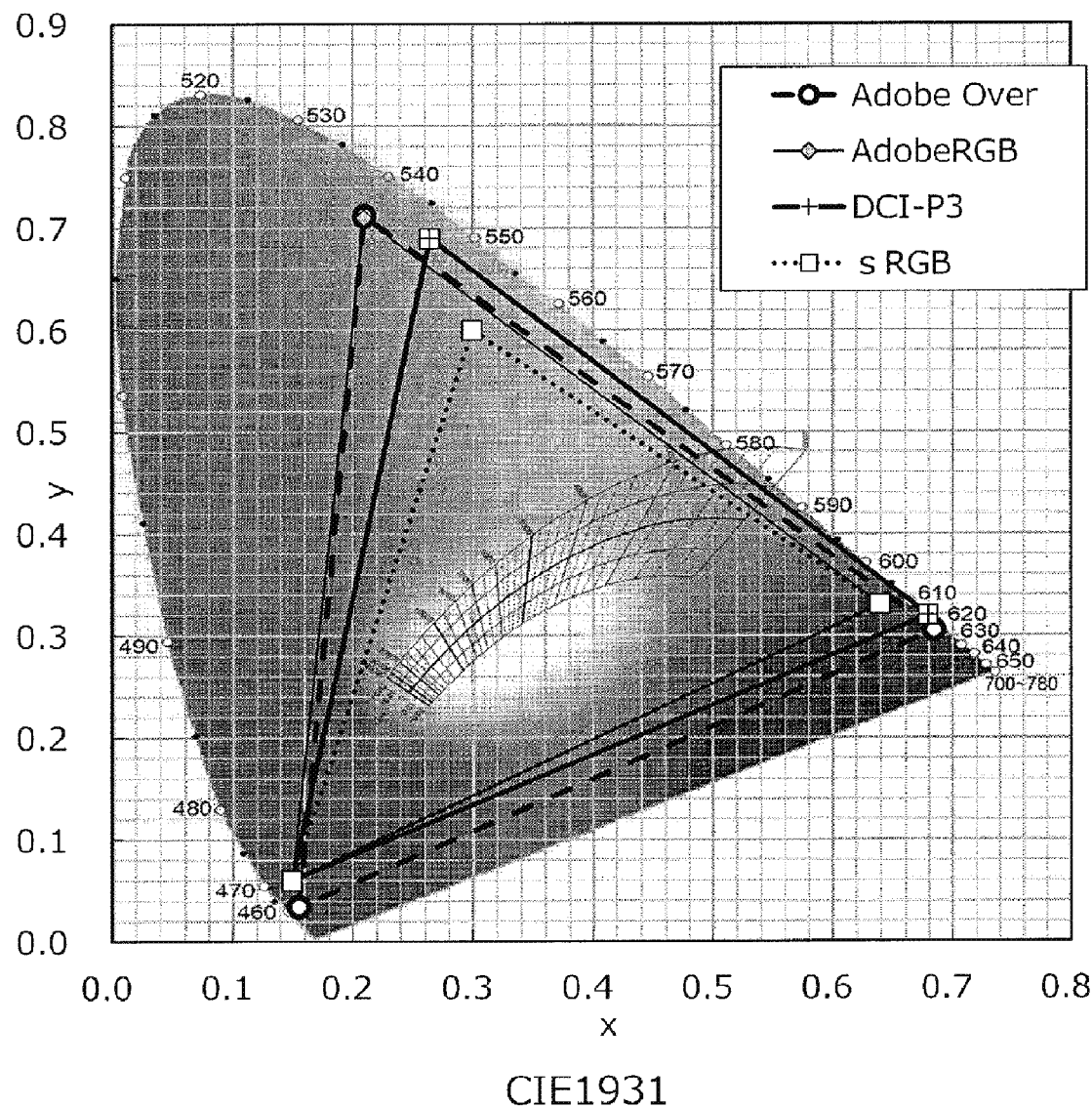
FIG. 21 is an xy chromaticity diagram (CIE 1931) showing the color gamuts of an Adobe Over standard, the Adobe RGB standard, the DCI-P3 standard, and the sRGB standard.
Figure 22:
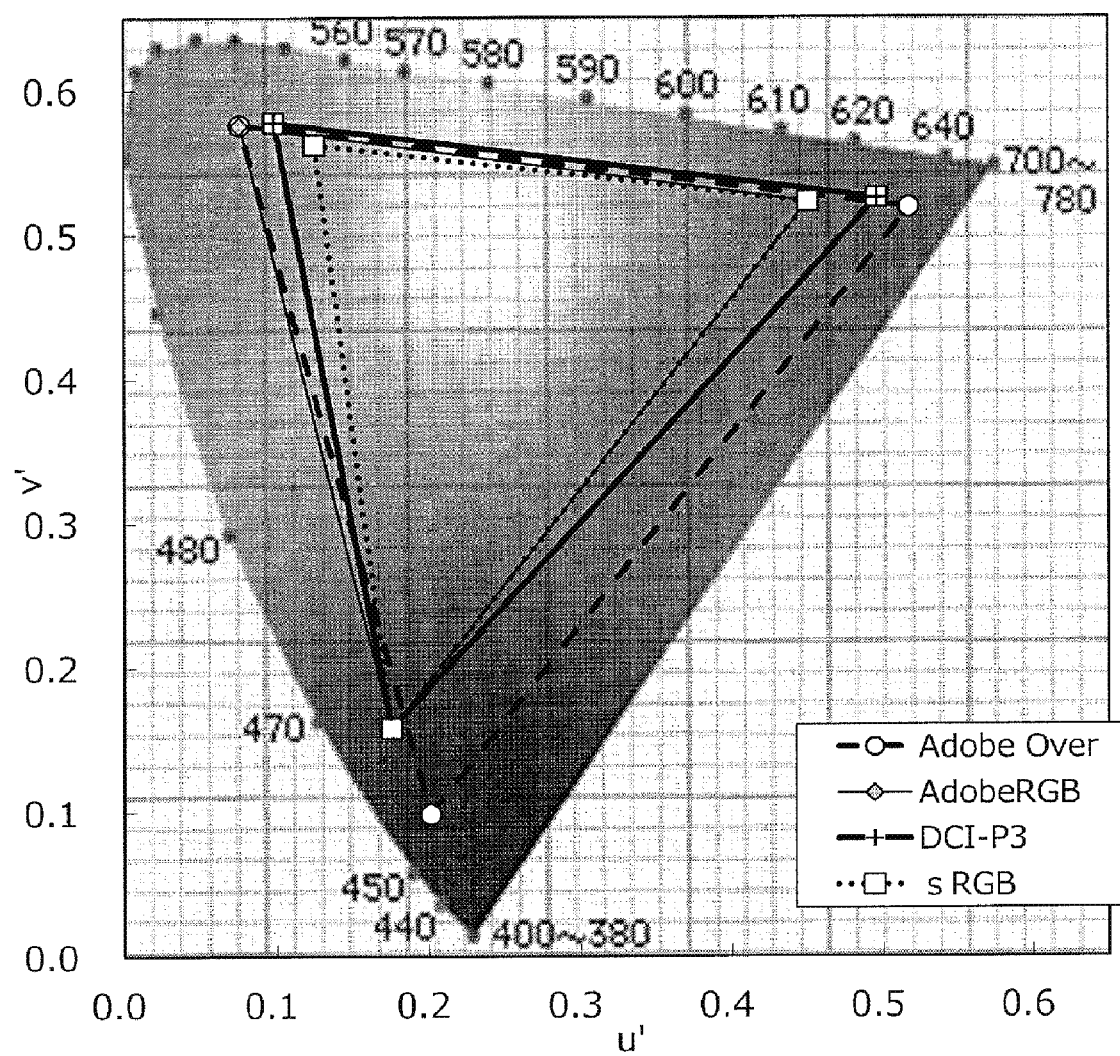
FIG. 22 is a u'v' chromaticity diagram (CIE 1976) showing the color gamuts of an Adobe Over standard, the Adobe RGB standard, the DCI-P3 standard, and the sRGB standard.

Next, an example in which the emission spectrum of the illumination device 2 and the transmission spectrums of the color filter layers 22 were set to make the color specifications of the liquid crystal display device 100 compliant with an "Adobe Over" standard will be described. Here, the Adobe Over standard refers to a custom-configured color standard that makes it possible to reproduce deeper colors (particularly deeper reds and deeper blues) than with the Adobe RGB standard. The color gamut of this Adobe Over standard is shown in FIGS. 21 and 22 and Tables 10 and 11. FIGS. 21 and 22 are an xy chromaticity diagram (CIE 1931) and a u'v' chromaticity diagram (CIE 1976), respectively, showing the color gamut of the Adobe Over standard. Moreover, Tables 10 and 11 respectively show the xy chromaticity values (Rx, Ry, Gx, Gy, Bx, and By) and the u'v' chromaticity values (Ru', Rv', Gu', Gv', Bu', and Bv') of the three primary colors in the Adobe Over standard. FIGS. 21 and 22 and Tables 10 and 11 also show the color gamuts of the Adobe RGB standard, the DCI-P3 standard, and the sRGB standard.

TABLE 10

|  | Rx | Ry | Gx | Gy | Bx | By |
|---|---|---|---|---|---|---|
| Adobe Over | 0.685 | 0.305 | 0.210 | 0.712 | 0.156 | 0.034 |
| Adobe RGB | 0.640 | 0.330 | 0.210 | 0.710 | 0.150 | 0.060 |
| DCI-P3 | 0.680 | 0.320 | 0.265 | 0.690 | 0.150 | 0.060 |
| sRGB | 0.640 | 0.330 | 0.300 | 0.600 | 0.150 | 0.060 |

TABLE 11

|  | Ru' | Rv' | Gu' | Gv' | Bu' | Bv' |
|---|---|---|---|---|---|---|
| Adobe Over | 0.518 | 0.519 | 0.076 | 0.576 | 0.201 | 0.098 |
| Adobe RGB | 0.451 | 0.523 | 0.076 | 0.576 | 0.175 | 0.158 |
| DCI-P3 | 0.496 | 0.526 | 0.099 | 0.578 | 0.175 | 0.158 |
| sRGB | 0.451 | 0.523 | 0.125 | 0.563 | 0.175 | 0.158 |

Figure 11:
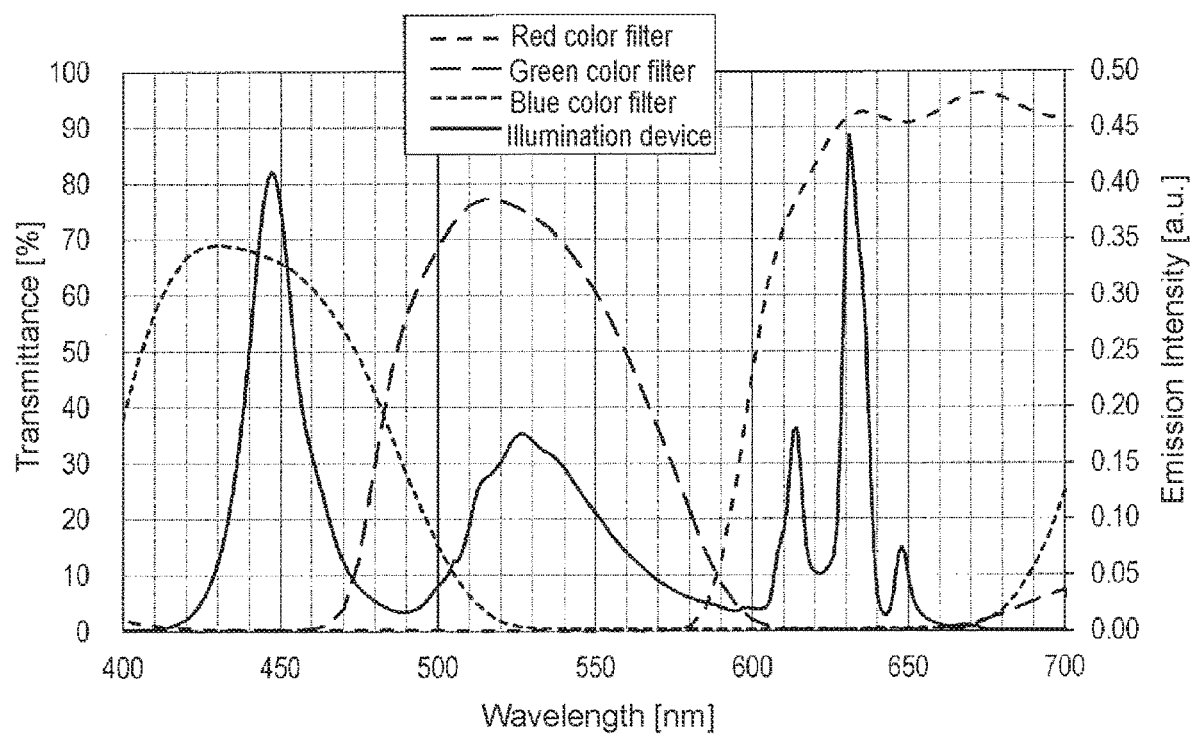
FIG. 11 is a graph showing the emission spectrum of the illumination device 2 and the transmission spectrums of color filter layers 22 (red color filters 22R, green color filters 22G, and blue color filters 22B) when the color specifications of the liquid crystal display device 100 were set to support deeper colors than in the Adobe RGB standard.

FIG. 11 shows the emission spectrum of the illumination device 2 and the transmission spectrums of the color filter layers 22 (the red color filters 22R, the green color filters 22G, and the blue color filters 22B) in the present example.

As shown in FIG. 11, the emission spectrum of the illumination device 2 has peaks in the wavelength regions of greater than or equal to 442 nm and less than or equal to 453 nm, greater than or equal to 525 nm and less than or equal to 535 nm, greater than or equal to 611 nm and less than or equal to 615 nm, greater than or equal to 629 nm and less than or equal to 633 nm, and greater than or equal to 645 nm and less than or equal to 649 nm. In other words, the emission spectrum of the illumination device 2 has a single peak in both the wavelength region corresponding to blues and the wavelength region corresponding to greens and has three peaks in the wavelength region corresponding to reds.

The transmission spectrum of the red color filters 22R exhibits a transmittance of less than or equal to 5% at wavelengths of greater than or equal to 400 nm and less than or equal to 580 nm, and then the transmittance begins to increase (significantly) at wavelengths of greater than or equal to 580 nm and less than or equal to 585 nm and reaches a value of greater than or equal to 80% at wavelengths of greater than or equal to 625 nm. Moreover, the wavelength at which the transmission spectrum of the red color filters 22R begins to exhibit a transmittance of greater than or equal to 50% is included in the range of greater than or equal to 595 nm and less than or equal to 605 nm.

The transmission spectrum of the green color filters 22G exhibits a peak in transmittance in the wavelength region of greater than or equal to 505 nm and less than or equal to 525 nm and exhibits a transmittance of less than or equal to 5% at wavelengths of less than or equal to 465 nm and at wavelengths of greater than or equal to 600 nm and less than or equal to 680 nm. Moreover, the wavelengths at which the transmission spectrum of the green color filters 22G exhibits a transmittance of 50% are respectively included in the range of greater than or equal to 485 nm and less than or equal to 490 nm and the range of greater than or equal to 556 nm and less than or equal to 562 nm.

The transmission spectrum of the blue color filters 22B exhibits a peak in transmittance in the wavelength region of greater than or equal to 420 nm and less than or equal to 450 nm and exhibits a transmittance of greater than or equal to 30% and less than or equal to 50% at a wavelength of 400 nm as well as a transmittance of greater than or equal to 10% and less than or equal to 20% at a wavelength of 500 nm. Moreover, the wavelengths at which the transmission spectrum of the blue color filters 22B exhibits a transmittance of 50% are respectively included in the range of greater than or equal to 400 nm and less than or equal to 410 nm and the range of greater than or equal to 468 nm and less than or equal to 478 nm.

Configuring the emission spectrum of the illumination device 2 and the transmission spectrums of the color filter layers 22 as described above makes it possible to achieve high panel transmittance as well as excellent color reproduction across an extremely wide gamut that far exceeds that of the Adobe RGB standard. More specifically, in a liquid crystal display panel in which the liquid crystal layer is made of a positive liquid crystal material, this makes it possible to achieve a transmittance of 2.73% as well as a high screen brightness that would correspond to a screen brightness index of 0.164 in Table 4. Moreover, attempting to achieve the same level of color reproduction in a liquid crystal display device in which the backlight includes blue-yellow pseudo-white LEDs as the light source (that is, attempting to make the color specifications of such a device compliant with the color standard described above) would require a significant increase in the thickness of the color filter layers. Therefore, depending on the use case of the liquid crystal display device (such as in a liquid crystal display device for a mobile device), this could be substantially impossible to achieve.

<Adobe RGB-Compliant Color Specifications>

Next, an example in which the emission spectrum of the illumination device 2 and the transmission spectrums of the color filter layers 22 were set to make the color specifications of the liquid crystal display device 100 compliant with the Adobe RGB standard will be described.

Figure 12:
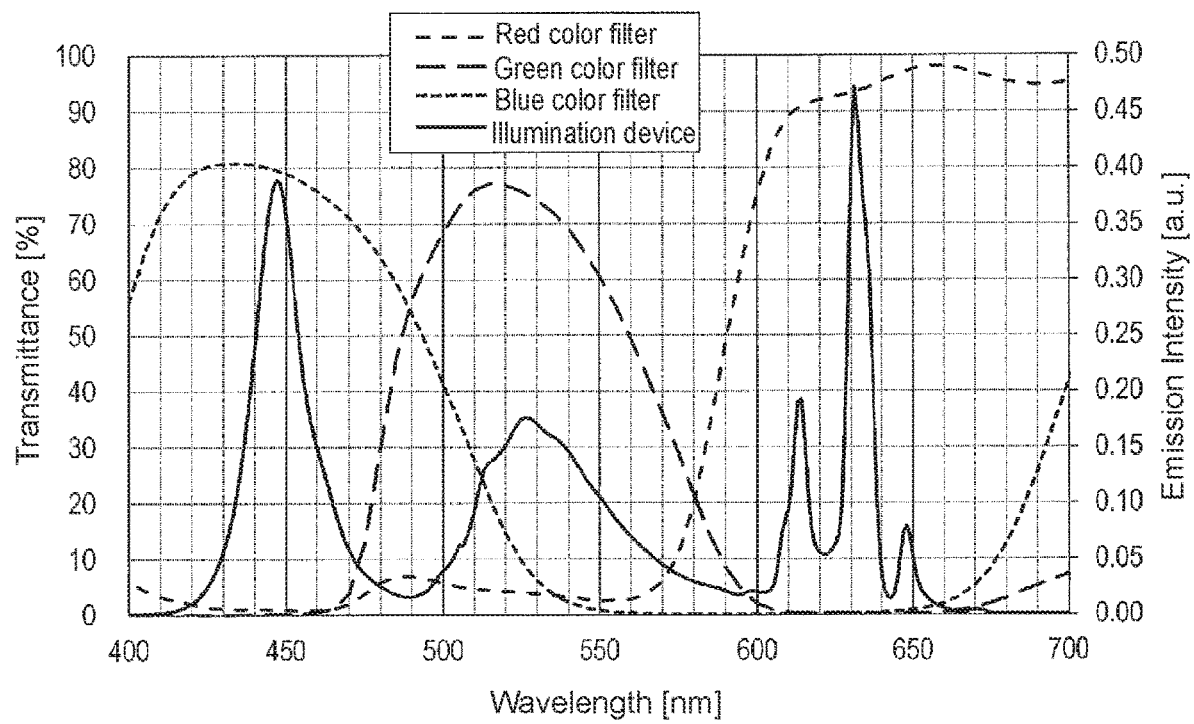
FIG. 12 is a graph showing the emission spectrum of the illumination device 2 and the transmission spectrums of the color filter layers 22 (the red color filters 22R, the green color filters 22G, and the blue color filters 22B) when the color specifications of the liquid crystal display device 100 were set to be compliant with the Adobe RGB standard.

FIG. 12 shows the emission spectrum of the illumination device 2 and the transmission spectrums of the color filter layers 22 (the red color filters 22R, the green color filters 22G, and the blue color filters 22B) in the present example.

As shown in FIG. 12, the emission spectrum of the illumination device 2 has peaks in the wavelength regions of greater than or equal to 442 nm and less than or equal to 453 nm, greater than or equal to 525 nm and less than or equal to 535 nm, greater than or equal to 611 nm and less than or equal to 615 nm, greater than or equal to 629 nm and less than or equal to 633 nm, and greater than or equal to 645 nm and less than or equal to 649 nm. In other words, the emission spectrum of the illumination device 2 has a single peak in both the wavelength region corresponding to blues and the wavelength region corresponding to greens and has three peaks in the wavelength region corresponding to reds.

The transmission spectrum of the red color filters 22R exhibits a transmittance of less than or equal to 10% at wavelengths of greater than or equal to 400 nm and less than or equal to 560 nm, and then the transmittance begins to increase (significantly) at wavelengths of greater than or equal to 560 nm and less than or equal to 570 nm and reaches a value of greater than or equal to 90% at wavelengths of greater than or equal to 620 nm. Moreover, the wavelength at which the transmission spectrum of the red color filters 22R begins to exhibit a transmittance of greater than or equal to 50% is included in the range of greater than or equal to 588 nm and less than or equal to 593 nm.

The transmission spectrum of the green color filters 22G exhibits a peak in transmittance in the wavelength region of greater than or equal to 505 nm and less than or equal to 525 nm and exhibits a transmittance of less than or equal to 5% at wavelengths of less than or equal to 465 nm and at wavelengths of greater than or equal to 600 nm and less than or equal to 680 nm. Moreover, the wavelengths at which the transmission spectrum of the green color filters 22G exhibits a transmittance of 50% are respectively included in the range of greater than or equal to 485 nm and less than or equal to 490 nm and the range of greater than or equal to 557 nm and less than or equal to 562 nm.

The transmission spectrum of the blue color filters 22B exhibits a peak in transmittance in the wavelength region of greater than or equal to 415 nm and less than or equal to 460 nm and exhibits a transmittance of greater than or equal to 50% and less than or equal to 70% at a wavelength of 400 nm as well as a transmittance of greater than or equal to 35% and less than or equal to 45% at a wavelength of 500 nm. Moreover, the wavelength at which the transmission spectrum of the blue color filters 22B exhibits a transmittance of 50% is included in the range of greater than or equal to 490 nm and less than or equal to 500 nm.

Configuring the emission spectrum of the illumination device 2 and the transmission spectrums of the color filter layers 22 as described above makes it possible to achieve high panel transmittance as well as excellent color reproduction that is compliant with the Adobe RGB standard. More specifically, in a liquid crystal display panel in which the liquid crystal layer is made of a positive liquid crystal material, this makes it possible to achieve a transmittance of 3.15% as well as a high screen brightness that would correspond to a screen brightness index of 0.190 in Table 4. Moreover, attempting to achieve the same level of color reproduction in a liquid crystal display device in which the backlight includes blue-yellow pseudo-white LEDs as the light source (that is, attempting to make the color specifications of such a device compliant with the Adobe RGB standard) would require a significant increase in the thickness of the color filter layers. Therefore, depending on the use case of the liquid crystal display device (such as in a liquid crystal display device for a mobile device), this could be substantially impossible to achieve.

<DCI-P3-Compliant Color Specifications>

Next, an example in which the emission spectrum of the illumination device 2 and the transmission spectrums of the color filter layers 22 were set to make the color specifications of the liquid crystal display device 100 compliant with the Digital Cinema Initiatives (DCI) P3 standard will be described.

Figure 13:
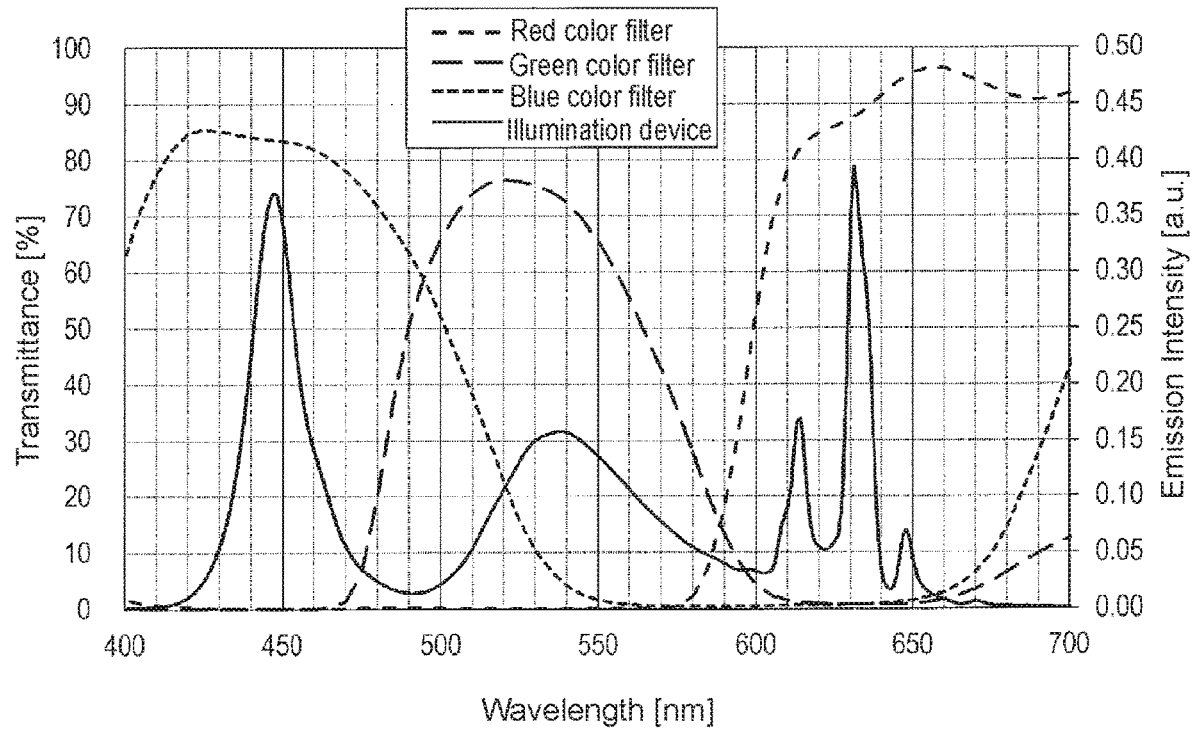
FIG. 13 is a graph showing the emission spectrum of the illumination device 2 and the transmission spectrums of the color filter layers 22 (the red color filters 22R, the green color filters 22G, and the blue color filters 22B) when the color specifications of the liquid crystal display device 100 were set to be compliant with a DCI standard.

FIG. 13 shows the emission spectrum of the illumination device 2 and the transmission spectrums of the color filter layers 22 (the red color filters 22R, the green color filters 22G, and the blue color filters 22B) in the present example.

As shown in FIG. 13, the emission spectrum of the illumination device 2 has peaks in the wavelength regions of greater than or equal to 442 nm and less than or equal to 453 nm, greater than or equal to 535 nm and less than or equal to 545 nm, greater than or equal to 611 nm and less than or equal to 615 nm, greater than or equal to 629 nm and less than or equal to 633 nm, and greater than or equal to 645 nm and less than or equal to 649 nm. In other words, the emission spectrum of the illumination device 2 has a single peak in both the wavelength region corresponding to blues and the wavelength region corresponding to greens and has three peaks in the wavelength region corresponding to reds.

The transmission spectrum of the red color filters 22R exhibits a transmittance of less than or equal to 5% at wavelengths of greater than or equal to 400 nm and less than or equal to 575 nm, and then the transmittance begins to increase (significantly) at wavelengths of greater than or equal to 575 nm and less than or equal to 580 nm and reaches a value of greater than or equal to 80% at wavelengths of greater than or equal to 620 nm. Moreover, the wavelength at which the transmission spectrum of the red color filters 22R begins to exhibit a transmittance of greater than or equal to 50% is included in the range of greater than or equal to 595 nm and less than or equal to 605 nm.

The transmission spectrum of the green color filters 22G exhibits a peak in transmittance in the wavelength region of greater than or equal to 512 nm and less than or equal to 532 nm and exhibits a transmittance of less than or equal to 5% at wavelengths of less than or equal to 470 nm and at wavelengths of greater than or equal to 600 nm and less than or equal to 670 nm. Moreover, the wavelengths at which the transmission spectrum of the green color filters 22G exhibits a transmittance of 50% are respectively included in the range of greater than or equal to 488 nm and less than or equal to 493 nm and the range of greater than or equal to 561 nm and less than or equal to 567 nm.

The transmission spectrum of the blue color filters 22B exhibits a peak in transmittance in the wavelength region of greater than or equal to 415 nm and less than or equal to 460 nm and exhibits a transmittance of greater than or equal to 50% and less than or equal to 70% at a wavelength of 400 nm as well as a transmittance of greater than or equal to 48% and less than or equal to 58% at a wavelength of 500 nm. Moreover, the wavelength at which the transmission spectrum of the blue color filters 22B exhibits a transmittance of 50% is included in the range of greater than or equal to 496 nm and less than or equal to 506 nm.

Configuring the emission spectrum of the illumination device 2 and the transmission spectrums of the color filter layers 22 as described above makes it possible to achieve high panel transmittance as well as excellent color reproduction that is compliant with the DCI-P3 standard. More specifically, in a liquid crystal display panel in which the liquid crystal layer is made of a positive liquid crystal material, this makes it possible to achieve a transmittance of 2.89% as well as a high screen brightness that would correspond to a screen brightness index of 0.227 in Table 4. Moreover, attempting to achieve the same level of color reproduction in a liquid crystal display device in which the backlight includes blue-yellow pseudo-white LEDs as the light source (that is, attempting to make the color specifications of such a device compliant with the DCI standard) would require a significant increase in the thickness of the color filter layers. Therefore, depending on the use case of the liquid crystal display device (such as in a liquid crystal display device for a mobile device), this could be substantially impossible to achieve.

<sRGB-Compliant Color Specifications>

Next, an example in which the emission spectrum of the illumination device 2 and the transmission spectrums of the color filter layers 22 were set to make the color specifications of the liquid crystal display device 100 compliant with the sRGB standard will be described.

Figure 14:
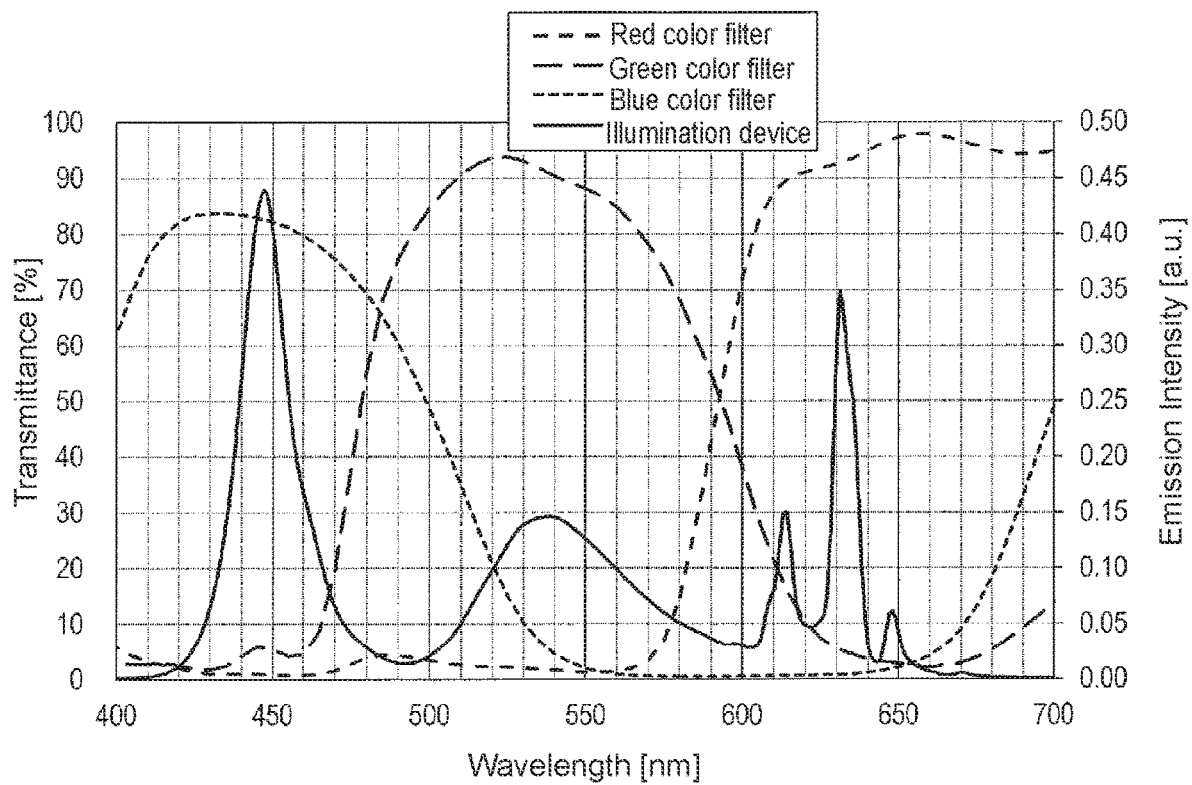
FIG. 14 is a graph showing the emission spectrum of the illumination device 2 and the transmission spectrums of the color filter layers 22 (the red color filters 22R, the green color filters 22G, and the blue color filters 22B) when the color specifications of the liquid crystal display device 100 were set to be compliant with the sRGB standard.

FIG. 14 shows the emission spectrum of the illumination device 2 and the transmission spectrums of the color filter layers 22 (the red color filters 22R, the green color filters 22G, and the blue color filters 22B) in the present example.

As shown in FIG. 14, the emission spectrum of the illumination device 2 has peaks in the wavelength regions of greater than or equal to 442 nm and less than or equal to 453 nm, greater than or equal to 535 nm and less than or equal to 545 nm, greater than or equal to 611 nm and less than or equal to 615 nm, greater than or equal to 629 nm and less than or equal to 633 nm, and greater than or equal to 645 nm and less than or equal to 649 nm. In other words, the emission spectrum of the illumination device 2 has a single peak in both the wavelength region corresponding to blues and the wavelength region corresponding to greens and has three peaks in the wavelength region corresponding to reds.

The transmission spectrum of the red color filters 22R exhibits a transmittance of less than or equal to 5% at wavelengths of greater than or equal to 400 nm and less than or equal to 560 nm, and then the transmittance begins to increase (significantly) at wavelengths of greater than or equal to 560 nm and less than or equal to 570 nm and reaches a value of greater than or equal to 90% at wavelengths of greater than or equal to 620 nm. Moreover, the wavelength at which the transmission spectrum of the red color filters 22R begins to exhibit a transmittance of greater than or equal to 50% is included in the range of greater than or equal to 590 nm and less than or equal to 595 nm.

The transmission spectrum of the green color filters 22G exhibits a peak in transmittance in the wavelength region of greater than or equal to 515 nm and less than or equal to 535 nm and exhibits a transmittance of less than or equal to 10% at wavelengths of less than or equal to 465 nm and at wavelengths of greater than or equal to 625 nm and less than or equal to 670 nm. Moreover, the wavelengths at which the transmission spectrum of the green color filters 22G exhibits a transmittance of 50% are respectively included in the range of greater than or equal to 477 nm and less than or equal to 482 nm and the range of greater than or equal to 590 nm and less than or equal to 595 nm.

The transmission spectrum of the blue color filters 22B exhibits a peak in transmittance in the wavelength region of greater than or equal to 415 nm and less than or equal to 460 nm and exhibits a transmittance of greater than or equal to 50% and less than or equal to 70% at a wavelength of 400 nm as well as a transmittance of greater than or equal to 45% and less than or equal to 55% at a wavelength of 500 nm. Moreover, the wavelength at which the transmission spectrum of the blue color filters 22B exhibits a transmittance of 50% is included in the range of greater than or equal to 495 nm and less than or equal to 505 nm.

Figure 15:
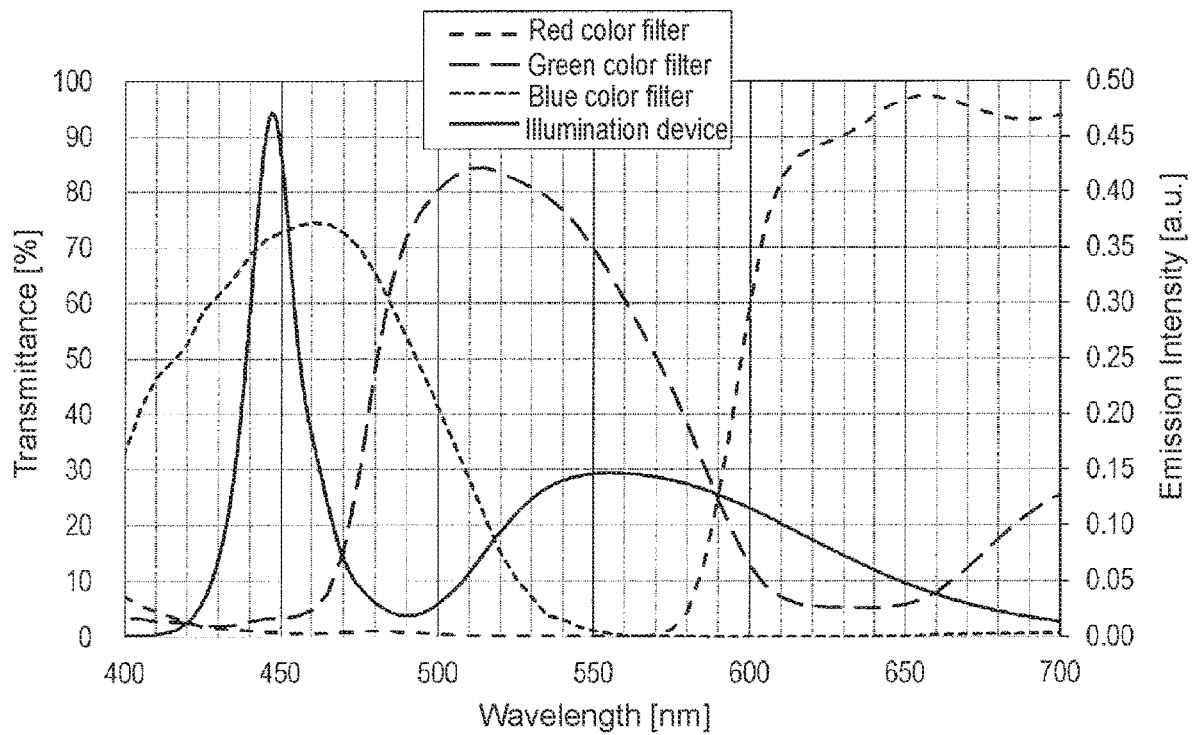
FIG. 15 is a graph showing the emission spectrum of an illumination device and the transmission spectrums of color filter layers (red color filters, green color filters, and blue color filters) in a liquid crystal display device in a comparison example in which the color specifications were set to be compliant with the sRGB standard.

Configuring the emission spectrum of the illumination device 2 and the transmission spectrums of the color filter layers 22 as described above makes it possible to achieve high panel transmittance as well as color reproduction that is compliant with the sRGB standard. More specifically, in a liquid crystal display panel in which the liquid crystal layer is made of a positive liquid crystal material, this makes it possible to achieve a transmittance of 3.95% as well as a high screen brightness that would correspond to a screen brightness index of 0.289 in Table 4. The working example for which the data is shown in FIG. 14 was a 5.2-inch liquid crystal display device (with a positive liquid crystal material) in which 12 side-emitting LEDs with a chromaticity of (x, y)=(0.270, 0.249) and a luminous flux of 7.291 m were used as the light source in the illumination device 2. This made it possible to achieve an exceptionally high panel transmittance of 3.95% as well as an exceptionally high screen brightness of 629 cd/m$^2$ when displaying a white color of chromaticity (x, y)=(0.30, 0.32). Meanwhile, in a liquid crystal display device in a comparison example that was designed and built to make it possible to achieve the same level of color reproduction, the panel transmittance was 2.93%, and the screen brightness when displaying the white color of chromaticity (x, y)=(0.30, 0.32) was 530 cd/m$^2$. In the liquid crystal display device in this comparison example, blue-yellow pseudo-white LEDs that had a luminous flux of 8.371 m and that were built using blue light-emitting elements with the same output characteristics as in the working example in combination with a high-efficiency YAG phosphor were used as the light source in the illumination device, and the transmission spectrums of the color filters were set to make the color specifications of the device compliant with the sRGB standard. FIG. 15 shows the emission spectrum of the illumination device and the transmission spectrums of the color filter layers (red color filters, green color filters, and blue color filters) in the liquid crystal display device in this comparison example. Here, the working example for which the data is shown in FIG. 14 exhibited an 18.7% improvement in screen brightness in comparison to the comparison example.

(Thickness of Color Filter Layers)

As described above, the liquid crystal display device 100 according to the embodiment of the present invention makes it possible to achieve excellent color reproduction and high panel transmittance. This makes it possible to increase the brightness and reduce the power consumption of the liquid crystal display device 100.

Furthermore, the color filter layers 22 only have to achieve a relatively low degree of color separation, thereby making it possible to reduce the thickness of the color filter layers 22 in comparison to in conventional configurations. More specifically, the embodiment of the present invention makes it possible to set the thickness t of the color filter layers 22 (that is, the respective thicknesses of the red color filters 22R, the green color filters 22G, and the blue color filters 22B) to less than or equal to 2.5 µm, thereby making it possible to reduce light leakage from adjacent pixels (color washout) when the display is viewed from an angle. Next, this point will be described in more detail.

Figure 16A:
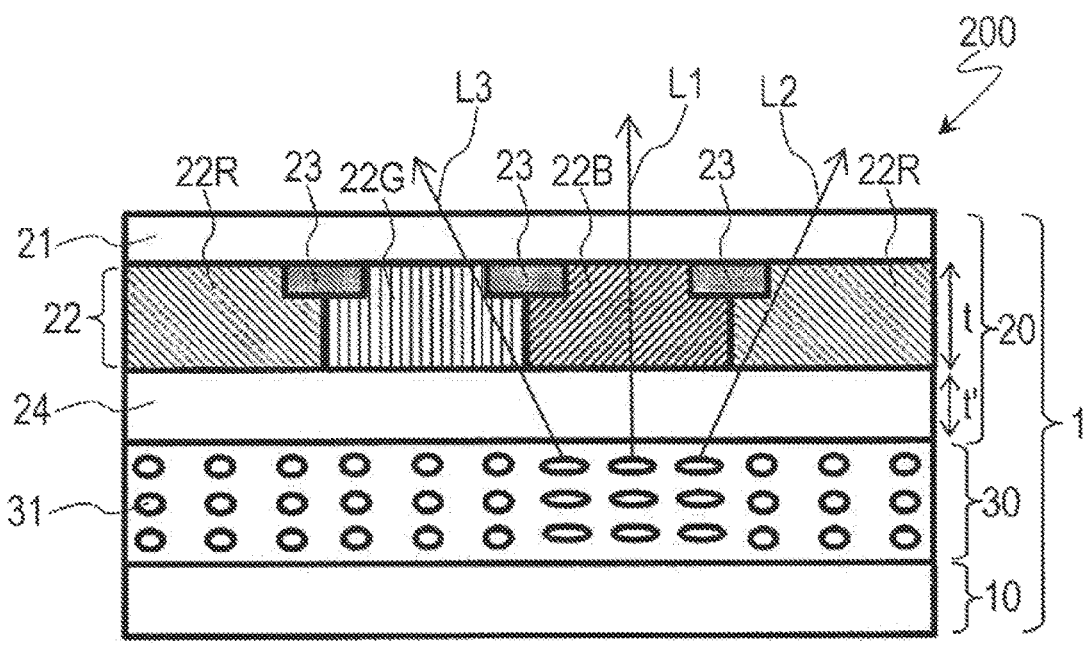
FIG. 16A schematically illustrates how color washout occurs in a liquid crystal display device 200 in a comparison example, and FIG. 16B schematically illustrates how the liquid crystal display device 100 according to the embodiment of the present invention reduces color washout.
Figure 16B:
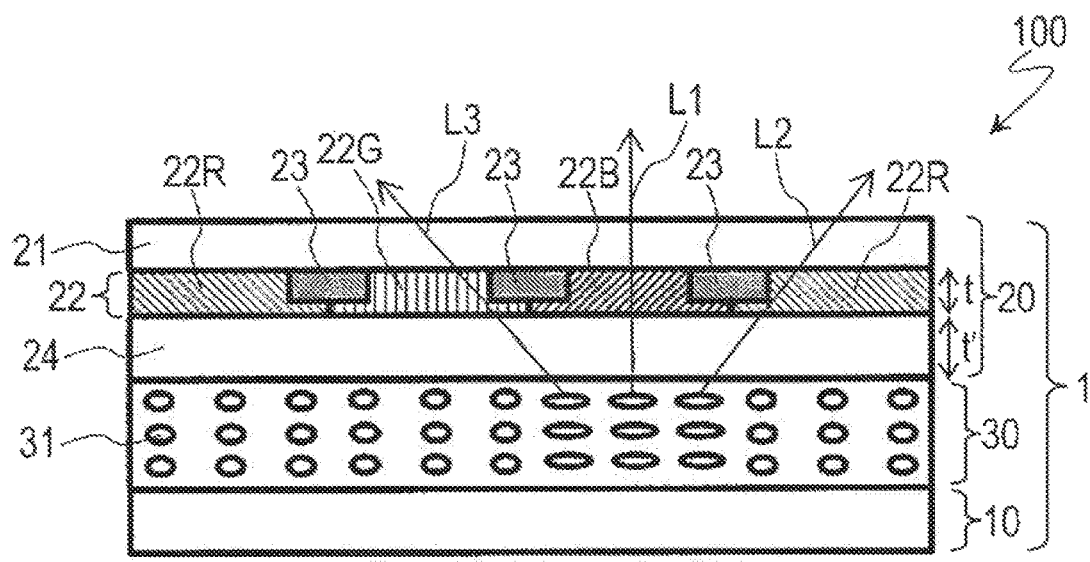

FIG. 16A schematically illustrates how color washout occurs in a liquid crystal display device 200 in a comparison example. Moreover, FIG. 16B schematically illustrates how the liquid crystal display device 100 according to the embodiment of the present invention reduces color washout. Note that FIGS. 16A and 16B illustrate a state in which only the blue pixels are illuminated (that is, a state in which a voltage is only applied to the liquid crystal layer 30 in the blue pixels, and therefore only the alignment state of the liquid crystal molecules 31 in the blue pixels changes) as an example.

In the liquid crystal display device 200 of the comparison example, the transmission spectrums of the color filter layers 22 are optimized relative to blue-yellow pseudo-white LEDs in order to make the color specifications compliant with a high color purity standard. This requires the thickness t of the color filter layers 22 to be approximately 3.0 µm, which results in the distance between the liquid crystal layer 30 and the light shielding layer 23 being relatively large. Therefore, although only the color blue (that is, light L1 that passes through the liquid crystal layer 30 in the blue pixels and then passes through the blue color filters 22B) will be visible when the device is viewed directly from the front, when the device is viewed from a shallow angle, the color red (that is, light L2 that passes through the liquid crystal layer 30 in the blue pixels and then passes through the red color filters 22R) and the color green (that is, light L3 that passes through the liquid crystal layer 30 in the blue pixels and then passes through the green color filters 22G) will both be visible as well. In this way, light leakage from adjacent pixels becomes more prominent when the thickness of the color filter layers 20 is large, thereby decreasing display quality.

In contrast, the liquid crystal display device 100 according to the embodiment of the present invention makes it possible to set the thickness of the color filter layers 20 to less than or equal to 2.5 µm, thereby making it possible to decrease the distance between the liquid crystal layer 30 and the light shielding layer 23. This reduces light leakage from adjacent pixels when the device is viewed from a shallow angle. In other words, in the example illustrated in FIG. 16B (in which only the blue pixels are illuminated), the color red (the light L2) and the color green (the light L3) that leak in from the adjacent pixels are not visible unless the device is viewed from a very shallow angle. In this way, decreasing the thickness of the color filter layers 20 reduces light leakage from adjacent pixels (color washout).

Here, whether color washout occurs is dependent on the magnitude of the distance between the liquid crystal layer 30 and the light shielding layer 23, and therefore configurations that include the planarizing layer 24 are typically more prone to color washout than configurations that do not include the planarizing layer 24. Meanwhile, in configurations in which a horizontal electric field mode such as an IPS mode or an FFS mode is used as the display mode, it is preferable that the planarizing layer 24 be formed for the following reasons. Unlike when using a vertical electric field mode (such as a TN mode or a VA mode), an electrode (transparent electrode layer) is not formed on the liquid crystal layer side of the opposite substrate (the color filter substrate) when using a horizontal electric field mode, and therefore the color filter material is exposed on the liquid crystal layer side. As a result, it becomes more difficult to generate the correct horizontal electric fields due to differences between the dielectric constants of the materials used for the red color filters, and green color filters, and the blue color filters. It is therefore preferable that the planarizing layer be formed to prevent this. Thus, the advantages of using a configuration such as that of the embodiment of the present invention are particularly pronounced when the display mode is a horizontal electric field mode.

As described above, setting the thickness t of the color filter layers 22 (that is, the respective thicknesses of the red color filters 22R, the green color filters 22G, and the blue color filters 22B) to less than or equal to 2.5 µm makes it possible to reduce light leakage from adjacent pixels when the display is viewed from an angle, thereby making it possible to improve display quality.

Alternatively, the area of the light shielding layer 23 may be decreased until the degree of light leakage from adjacent pixels is approximately equal to in the liquid crystal display device 200 of the comparison example. This makes it possible to increase the pixel aperture ratio, thereby making it possible to significantly increase light utilization efficiency.

(Expanding the Light Shielding Layer)

The area of the light shielding layer 23 may also be increased in order to more reliably reduce light leakage from adjacent pixels. In this case, although the pixel aperture ratio decreases, the embodiment of the present invention still makes it possible to achieve high transmittance in the color filter layers 22, thereby making it possible to keep the overall panel transmittance equal to or greater than that of conventional configurations. Next, this will be described in more detail with reference to FIG. 17A, FIG. 17B, and FIG. 17C.

Figure 17A:
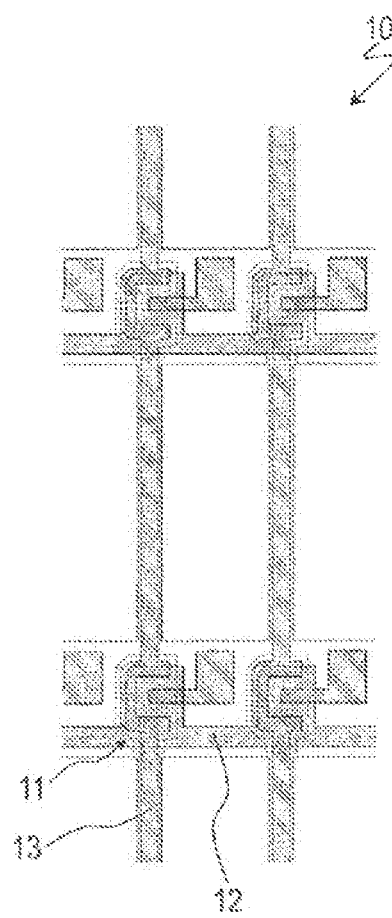
FIG. 17A is a plan view schematically illustrating a TFT substrate 10 in a 7-inch WXGA liquid crystal display panel 1.
Figure 17B:
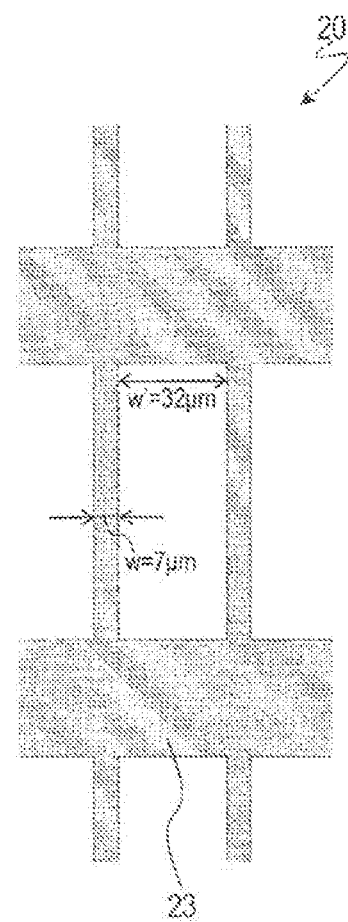
FIGS. 17B and 17C are plan views schematically illustrating a color filter substrate 20 to be arranged facing the TFT substrate 10 illustrated in FIG. 17A.
Figure 17C:
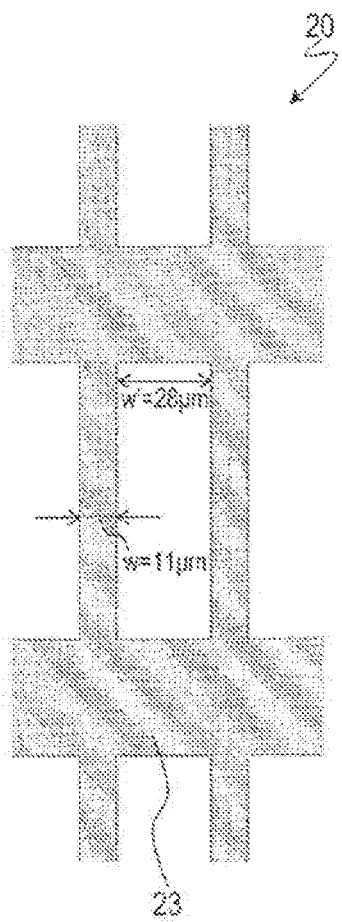

FIG. 17A is a plan view schematically illustrating a TFT substrate 10 in a 7-inch WXGA liquid crystal display panel 1, while FIGS. 17B and 17C are plan views schematically illustrating a color filter substrate 20 to be arranged facing the TFT substrate 10 illustrated in FIG. 17A.

As illustrated in FIG. 17A, the TFT substrate 10 includes TFTs 11 that are formed for each pixel, scanning lines 12 for supplying scanning signals to the TFTs 11, and signal lines 13 for supplying display signals to the TFTs 11. Note that in FIG. 17A, other components such as pixel electrodes and contact holes are not explicitly illustrated.

As illustrated in FIGS. 17B and 17C, the color filter substrate 20 includes a light shielding layer 23. The light shielding layer 23 is formed in a grid pattern in which substantially rectangular openings are positioned in regions corresponding to the pixels.

In the example illustrated in FIG. 17B, the width w of the portions of the light shielding layer 23 that overlap with the signal lines 13 is 7 µm, and the width w' of the openings (the region in which the light shielding layer 23 is not formed) in the row direction (the direction in which the scanning lines 12 run) is 32 µm. Here, the pixel aperture ratio is 58%.

Meanwhile, in the example illustrated in FIG. 17C, the width w of the portions of the light shielding layer 23 that overlap with the signal lines 13 is 11 µm, and the width w' of the openings in the row direction is 28 µm. Here, the pixel aperture ratio is 51%.

In the example in FIG. 17C, the width w of the portions of the light shielding layer 23 that overlap with the signal lines 13 is greater than in the example in FIG. 17B. Therefore, the example in FIG. 17C reduces light leakage from adjacent pixels to a greater extent than the example in FIG. 17B. Moreover, although the pixel aperture ratio of the example in FIG. 17C is less than that of the example in FIG. 17B, the embodiment of the present invention still makes it possible to achieve high transmittance in the color filter layers 22. Therefore, even when the area of the light shielding layer 23 is increased, as in the example in FIG. 17C, the overall panel transmittance can be kept equal to or greater than that of conventional configurations.

The advantageous effect described above is particularly pronounced in wide viewing angle display modes (horizontal electric field modes such as IPS modes and FFS modes) where high display quality is also required when viewing the device from an angle.

Moreover, increasing the area of the light shielding layer 23 increases the allowable amount of shifting between the TFT substrate 10 and the color filter substrate 20, thereby making it possible to improve manufacturing yield as well.

(Specific Example of Pixel Configuration)

Various display modes can be used as the display mode for the liquid crystal display device 100 according to the embodiment of the present invention. Here, a specific pixel configuration for an FFS mode (one type of horizontal electric field mode) will be described as an example.

Figure 18:
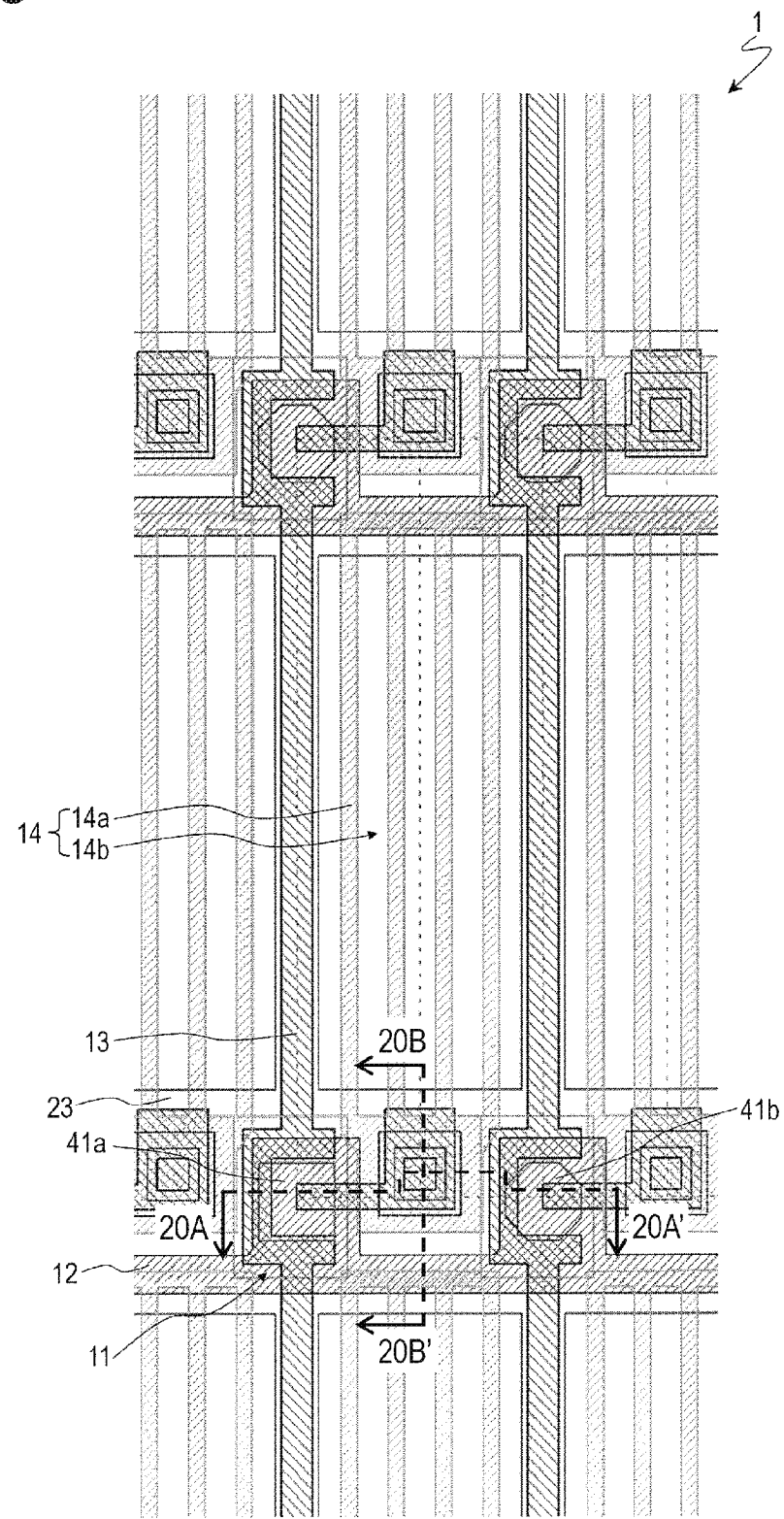
FIG. 18 is a plan view schematically illustrating a liquid crystal display panel 1 for an FFS-mode liquid crystal display device 100.
Figure 19A:
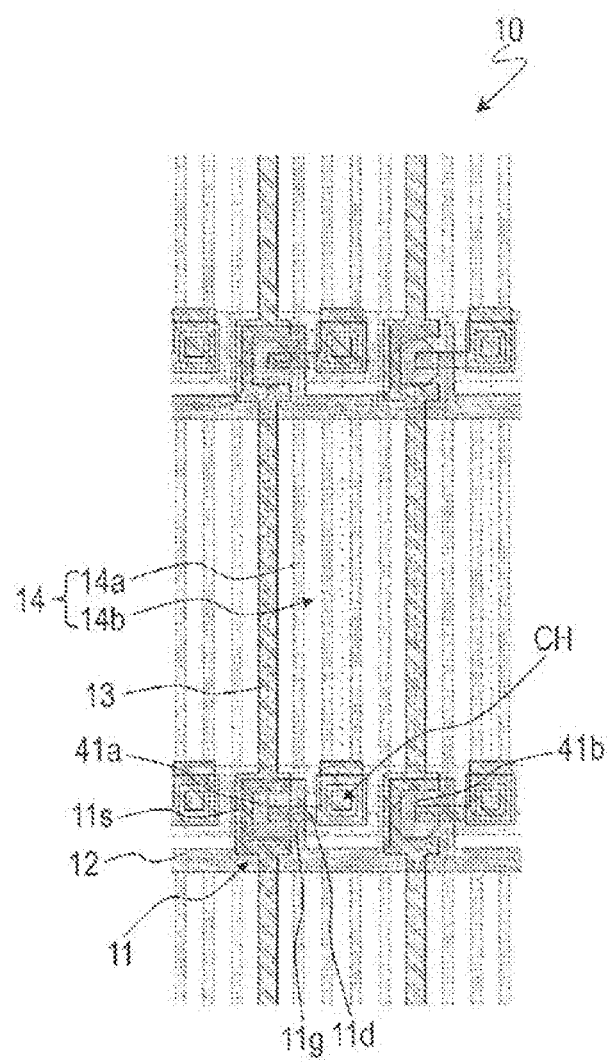
FIGS. 19A and 19B are plan views schematically illustrating a TFT substrate 10 and a color filter substrate 20, respectively, for the FFS-mode liquid crystal display device 100.
Figure 19B:
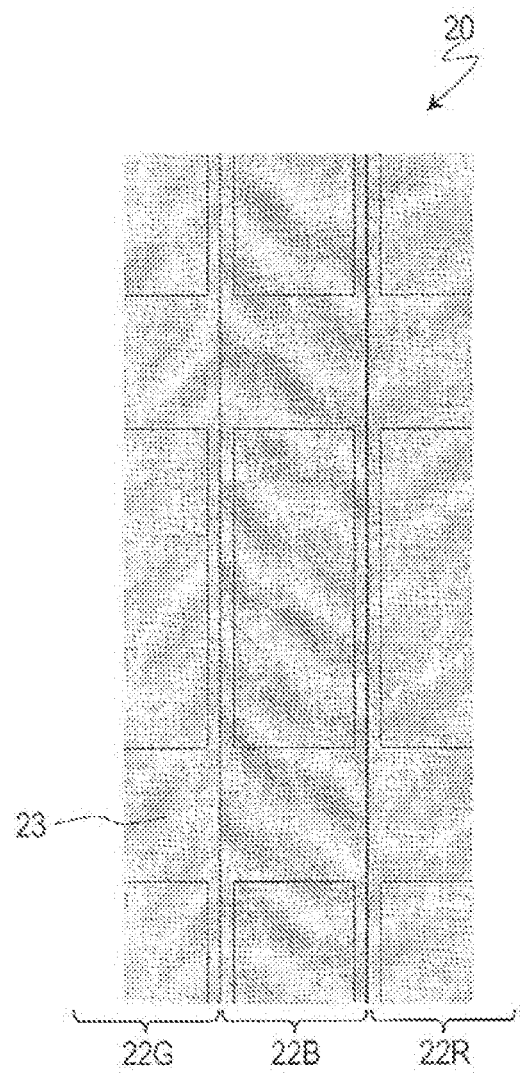
Figure 20A:
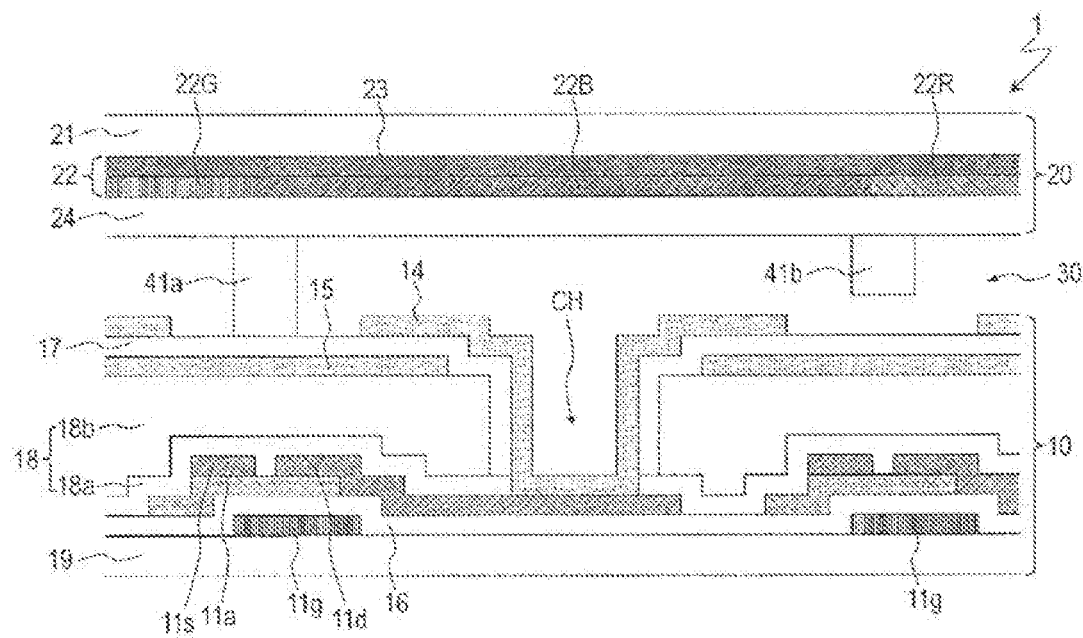
FIG. 20A is a cross-sectional view taken along line 20A-20A' in FIG. 18.
Figure 20B:
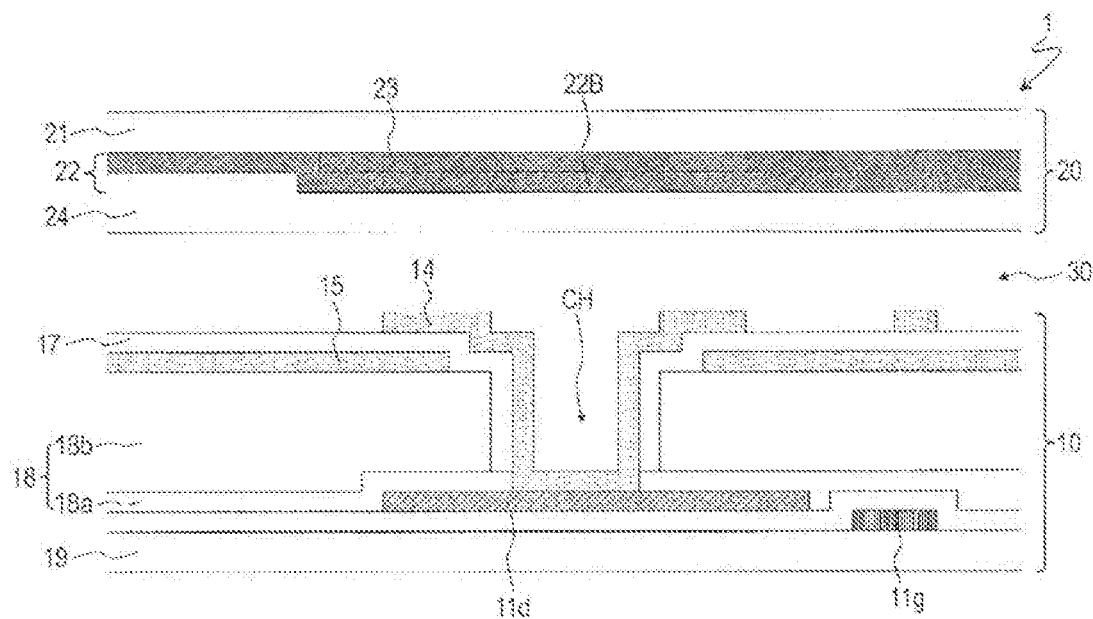
FIG. 20B is a cross-sectional view taken along line 20B-20B' in FIG. 18.

FIGS. 18 to 20 illustrate a pixel configuration for an FFS-mode liquid crystal display device 100. FIG. 18 is a plan view schematically illustrating a liquid crystal display panel 1. FIGS. 19A and 19B are plan views schematically illustrating a TFT substrate 10 and a color filter substrate 20, respectively. FIGS. 20A and 20B are cross-sectional views respectively taken along lines 20A-20A' and 20B-20B' in FIG. 18.

The TFT substrate 10 includes TFTs 11 that are formed for each pixel, scanning lines 12 for supplying scanning signals to the TFTs 11, and signal lines 13 for supplying display signals to the TFTs 11. The TFT substrate 10 further includes pixel electrodes 14 that are electrically connected to the TFTs 11 and a common electrode 15 to which a common voltage is supplied.

Each of the TFTs 11 includes a gate electrode 11g, a gate insulating layer (an SiNx layer, for example) 16, a semiconductor layer 11a, a source electrode 11s, and a drain electrode 11d. The gate electrode 11g is electrically connected to the respective scanning line 12. Moreover, the source electrode 11s is electrically connected to the respective signal line 13, and the drain electrode 11d is electrically connected to the respective pixel electrode 14.

Various well-known semiconductor materials can be used as the material for the semiconductor layers 11a of the TFTs 11. For example, amorphous silicon, polycrystalline silicon, continuous grain silicon (CGS), or the like can be used. Alternatively, an oxide semiconductor such as an In—Ga—Zn—O semiconductor may be used.

The scanning lines 12 run substantially parallel to one another in the row direction. Meanwhile, the signal lines 13 run substantially parallel to one another in the column direction.

Each of the pixel electrodes 14 includes a plurality of elongated electrode portions 14a and a plurality of slits 14b. The numbers of the elongated electrode portions 14a and the slits 14b are not limited to the examples illustrated in FIG. 18 or the like. Moreover, the pixel electrodes 14 are made of a transparent conductive material (such as ITO or IZO).

The common electrode 15 is formed beneath the pixel electrodes 14 so as to overlap with the pixel electrodes 14 with a dielectric layer (such as an SiNx layer) 17 interposed therebetween. Moreover, the common electrode 15 is made of a transparent conductive material (such as ITO or IZO).

An interlayer insulating layer 18 is formed covering the TFTs 11 and the signal lines 13, and the common electrode 15 is formed on this interlayer insulating layer 18. In the configuration illustrated here, the interlayer insulating layer 18 includes an inorganic insulating layer (such as an SiNx layer) 18a and an organic insulating layer (made of a photosensitive resin, for example) 18b.

Contact holes CH are formed in the interlayer insulating layer 18. The pixel electrodes 14 are respectively connected to the drain electrodes 11d of the TFTs 11 within these contact holes CH. The components of the TFT substrate 10 described above are supported by an insulating transparent substrate (such as a glass substrate) 19.

The color filter substrate 20 includes color filter layers 22 (red color filters 22R, green color filters 22G, and blue color filters 22B) and a light shielding layer (black matrix) 23. The red color filters 22R, the green color filters 22G, and the blue color filters 22B are respectively formed in regions corresponding to red pixels, regions corresponding to green pixels, and regions corresponding to blue pixels. The light shielding layer 23 is formed in a grid pattern running between adjacent pixels.

A planarizing layer 24 is formed on the color filter layers 22. Moreover, a plurality of columnar spacers 41 for defining the thickness (cell gap) of a liquid crystal layer 30 are formed on the planarizing layer 24. This plurality of columnar spacers 41 includes relatively tall main spacers 41a and relatively short sub-spacers 41b. The components of the color filter substrate 20 described above are supported by an insulating transparent substrate (such as a glass substrate) 21.

Horizontal alignment films (not illustrated in the figure) are respectively formed on the liquid crystal layer 30 side surfaces of the TFT substrate 10 and the color filter substrate 20.

In the FFS-mode liquid crystal display device 100 configured as described above, horizontal electric fields (oblique electric fields) are generated using the pixel electrodes 14 and the common electrode 15, and these horizontal electric fields are used to rotate the liquid crystal molecules within the substrate plane in order to display images.

INDUSTRIAL APPLICABILITY

The embodiment of the present invention provides a liquid crystal display device that makes it possible to achieve excellent color reproduction and high panel transmittance.

DESCRIPTION OF REFERENCE CHARACTERS 1 liquid crystal display panel
2 illumination device
10 active matrix substrate (TFT substrate)
20 color filter substrate (opposite substrate)
22 color filter layer
22R red color filter
22G green color filter
22B blue color filter
23 light shielding layer (black matrix)
24 planarizing layer
51 light-emitting element 52 green phosphor
53 red phosphor
100 liquid crystal display device

What is claimed is:

1. A liquid crystal display device, comprising:
a liquid crystal display panel including a red color filter, a green color filter, and a blue color filter; and
an illumination device illuminating the liquid crystal display panel with white light,
wherein the liquid crystal display panel includes: a thin-film transistor (TFT) substrate that includes a TFT, a pixel electrode connected to the TFT, and a common electrode;
a color filter substrate that includes the red color filter, the green color filter, and the blue color filter; and
a liquid crystal layer that is arranged between the TFT substrate and the color filter substrate,
the illumination device includes a light-emitting element that emits blue light, a green phosphor that absorbs a portion of the blue light emitted from the light-emitting element and then emits green light, and a red phosphor that absorbs a portion of the blue light emitted from the light-emitting element and then emits red light,
wherein the blue color filter is made of a colored material that contains a dye,
wherein chromaticity values x, y of the white light emitted from the illumination device satisfy relationships 0.24<x and 0.24<y, and
wherein the dye contained in the colored material is a triphenylmethane dye,
wherein a ratio Ia/Ib of an emission spectrum of the red phosphor is less than 0.1, where Ia is an integrated intensity at wavelengths greater than or equal of 650 nm and Ib is an integrated intensity over all wavelength regions.

2. The liquid crystal display device according to claim 1, wherein thicknesses of the red color filter, the green color filter, and the blue color filter are each less than or equal to 2.5 μm.

3. The liquid crystal display device according to claim 1, wherein the color filter substrate further includes a planarizing layer formed covering the red color filter, the green color filter, and the blue color filter.

4. The liquid crystal display device according to claim 1, wherein the colored material further contains a pigment.

5. The liquid crystal display device according to claim 1:
wherein an emission spectrum of the illumination device has peaks in wavelength regions of 442 nm to 453 nm, 525 nm to 535 nm, 611 nm to 615 nm, 629 nm to 633 nm, and 645 nm to 649 nm,
wherein a transmission spectrum of the red color filter exhibits a transmittance of less than or equal to 5% at wavelengths of 400 nm to 580 nm, exhibits an increase in transmittance at wavelengths of 580 nm to 585 nm, and exhibits a transmittance of greater than or equal to 80% at wavelengths of greater than or equal to 625 nm, and a wavelength at which the transmission spectrum of the red color filter exhibits a transmittance of greater than or equal to 50% is included in a range of 595 nm to 605 nm,
wherein a transmission spectrum of the green color filter has a peak in transmittance in a wavelength region of 505 nm to 525 nm, exhibits a transmittance of less than or equal to 5% at wavelengths of less than or equal to 465 nm and at wavelengths of 600 nm to 680 nm, and wavelengths at which the transmission spectrum of the green color filter exhibits a transmittance of 50% are respectively included in a range of 485 nm to 490 nm and a range of 556 nm to 562 nm, and
wherein a transmission spectrum of the blue color filter has a peak in transmittance in a wavelength region of 420 nm to 450 nm, exhibits a transmittance of 30% to 50% at a wavelength of 400 nm and a transmittance of 10% to 20% at a wavelength of 500 nm, and wavelengths at which the transmission spectrum of the blue color filter exhibits a transmittance of 50% are respectively included in a range of 400 nm to 410 nm and a range of 468 nm to 478 nm.

6. The liquid crystal display device according to claim 1:
wherein an emission spectrum of the illumination device has peaks in wavelength regions of 442 nm to 453 nm, 525 nm to 535 nm, 611 nm to 615 nm, 629 nm to 633 nm, and 645 nm to 649 nm,
wherein a transmission spectrum of the red color filter exhibits a transmittance of less than or equal to 10% at wavelengths of 400 nm to 560 nm, exhibits an increase in transmittance at wavelengths of 560 nm to 570 nm, and exhibits a transmittance of greater than or equal to 90% at wavelengths of greater than or equal to 620 nm, and a wavelength at which the transmission spectrum of the red color filter exhibits a transmittance of 50% is included in a range of 588 nm to 593 nm,
wherein a transmission spectrum of the green color filter has a peak in transmittance in a wavelength region of 505 nm to 525 nm, exhibits a transmittance of less than or equal to 5% at wavelengths of less than or equal to 465 nm and at wavelengths of 600 nm to 680 nm, and wavelengths at which the transmission spectrum of the green color filter exhibits a transmittance of 50% are respectively included in a range of 485 nm to 490 nm and a range of 557 nm to 562 nm, and
wherein a transmission spectrum of the blue color filter has a peak in transmittance in a wavelength region of 415 nm to 460 nm, exhibits a transmittance of 50% to 70% at a wavelength of 400 nm and a transmittance of 35% to 45% at a wavelength of 500 nm, and a wavelength at which the transmission spectrum of the blue color filter exhibits a transmittance of 50% is included in a range of 490 nm to 500 nm.

7. The liquid crystal display device according to claim 1:
wherein an emission spectrum of the illumination device has peaks in wavelength regions of 442 nm to 453 nm, 535 nm to 545 nm, 611 nm to 615 nm, 629 nm to 633 nm, and 645 nm to 649 nm,
wherein a transmission spectrum of the red color filter exhibits a transmittance of less than or equal to 5% at wavelengths of 400 nm to 575 nm, exhibits an increase in transmittance at wavelengths of 575 nm to 580 nm, and exhibits a transmittance of greater than or equal to 90% at wavelengths of greater than or equal to 620 nm, and a wavelength at which the transmission spectrum of the red color filter exhibits a transmittance of greater than or equal to 50% is included in a range of 595 nm to 605 nm,
wherein a transmission spectrum of the green color filter has a peak in transmittance in a wavelength region of 512 nm to 532 nm, exhibits a transmittance of less than or equal to 5% at wavelengths of less than or equal to 470 nm and at wavelengths of 600 nm to 670 nm, and wavelengths at which the transmission spectrum of the green color filter exhibits a transmittance of 50% are respectively included in a range of 488 nm to 493 nm and a range of 561 nm to 567 nm, and wherein a transmission spectrum of the blue color filter has a peak in a wavelength region of 415 nm to 460 nm, exhibits a transmittance of 50% to 70% at a wavelength of 400 nm and a transmittance of 48% to 58% at a wavelength of 500 nm, and a wavelength at which the transmission spectrum of the blue color filter exhibits a transmittance of 50% is included in a range of 496 nm to 505 nm.

8. The liquid crystal display device according to claim 1:
wherein an emission spectrum of the illumination device has peaks in wavelength regions of 442 nm to 453 nm, 535 nm to 545 nm, 611 nm to 615 nm, 629 nm to 633 nm, and 645 nm to 649 nm,
wherein a transmission spectrum of the red color filter exhibits a transmittance of less than or equal to 5% at wavelengths of 400 nm to 560 nm, exhibits an increase in transmittance at wavelengths of 560 nm to 570 nm, and exhibits a transmittance of greater than or equal to 90% at wavelengths of greater than or equal to 620 nm, and a wavelength at which the transmission spectrum of the red color filter exhibits a transmittance of greater than or equal to 50% is included in a range of 590 nm to 595 nm,
wherein a transmission spectrum of the green color filter has a peak in transmittance in a wavelength region of 515 nm to 535 nm, exhibits a transmittance of less than or equal to 10% at wavelengths of less than or equal to 465 nm and at wavelengths of 625 nm to 670 nm, and wavelengths at which the transmission spectrum of the green color filter exhibits a transmittance of 50% are respectively included in a range of 477 nm to 482 nm and a range of 590 nm to 595 nm, and
wherein a transmission spectrum of the blue color filter has a peak in transmittance in a wavelength region of 415 nm to 460 nm, exhibits a transmittance of 50% to 70% at a wavelength of 400 nm and a transmittance of 45% to 55% at a wavelength of 500 nm, and a wavelength at which the transmission spectrum of the blue color filter exhibits a transmittance of 50% is included in a range of 495 nm to 505 nm.

9. The liquid crystal display device according to claim 1:
wherein the red phosphor is a tetravalent manganese-activated fluoro-tetravalent metalate phosphor represented by a general formula (B): $M^I_2(M^{II}_{1-h}Mn_h)F_6$, where $M^I$ is at least one alkali metal element selected from Li, Na, K, Rb, and Cs; $M^{II}$ is at least one tetravalent element selected from Ge, Si, Sn, Ti, and Zr; and h satisfies the relationship $0.01<h<0.2$.

* * * * *